(12) United States Patent
Sung et al.

(10) Patent No.: US 12,453,249 B2
(45) Date of Patent: Oct. 21, 2025

(54) DISPLAY DEVICE AND METHOD FOR MANUFACTURING THE SAME

(71) Applicant: Samsung Display Co., Ltd., Yongin-si (KR)

(72) Inventors: Woo Yong Sung, Yongin-si (KR); Seungyong Song, Yongin-si (KR); Jeongseok Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 438 days.

(21) Appl. No.: 18/109,761

(22) Filed: Feb. 14, 2023

(65) Prior Publication Data
US 2023/0329042 A1 Oct. 12, 2023

(30) Foreign Application Priority Data

Apr. 8, 2022 (KR) .......................... 10-2022-0043765

(51) Int. Cl.
| | | |
|---|---|---|
| *H10K 59/122* | (2023.01) | |
| *G06F 3/041* | (2006.01) | |
| *H10K 59/12* | (2023.01) | |
| *H10K 59/40* | (2023.01) | |
| *H10K 59/80* | (2023.01) | |

(52) U.S. Cl.
CPC ......... *H10K 59/122* (2023.02); *G06F 3/0412* (2013.01); *H10K 59/1201* (2023.02); *H10K 59/40* (2023.02); *H10K 59/873* (2023.02); *G06F 2203/04103* (2013.01)

(58) Field of Classification Search
None
See application file for complete search history.

(56) References Cited

U.S. PATENT DOCUMENTS

| | | | |
|---|---|---|---|
| 10,566,572 B2 | 2/2020 | Oh et al. | |
| 10,811,478 B2 | 10/2020 | Choi et al. | |
| 10,978,669 B2 | 4/2021 | Lee et al. | |
| 11,205,685 B2 | 12/2021 | Han et al. | |
| 2023/0240096 A1* | 7/2023 | Sung | H10K 59/873 |

FOREIGN PATENT DOCUMENTS

| | | |
|---|---|---|
| KR | 10-2016-0072010 A | 6/2016 |
| KR | 10-1818480 B1 | 1/2018 |
| KR | 10-2019-0082362 A | 7/2019 |
| KR | 10-2020-0014463 A | 2/2020 |
| KR | 10-2076620 B1 | 2/2020 |
| KR | 10-2248402 B1 | 5/2021 |

\* cited by examiner

*Primary Examiner* — Kyoung Lee
(74) *Attorney, Agent, or Firm* — Womble Bond Dickinson (US) LLP

(57) ABSTRACT

A display device includes: a base layer; a circuit layer on the base layer; a light emitting element including a first electrode on the circuit layer, a functional layer on the first electrode, and a second electrode on the functional layer; a pixel defining film on the circuit layer and having a first pixel opening; a first auxiliary pixel defining film which includes a metal substance and is between the pixel defining film and the circuit layer and having a second pixel opening; and a second auxiliary pixel defining film between the circuit layer and the first auxiliary pixel defining film and having a third pixel opening, which exposes one surface of the first electrode, wherein the second electrode is in contact with the first auxiliary pixel defining film.

29 Claims, 16 Drawing Sheets

DISPLAY DEVICE AND METHOD FOR MANUFACTURING THE SAME

CROSS-REFERENCE TO RELATED APPLICATION

The present application claims priority to and the benefit of Korean Patent Application No. 10-2022-0043765, filed on Apr. 8, 2022, the entire content of which is hereby incorporated by reference.

BACKGROUND

1. Field

Aspects of some embodiments of the present disclosure herein relate to a display device and a method for manufacturing the same.

2. Description of the Related Art

A display device may be manufactured including an organic electroluminescent material or a quantum dot luminescent material. These luminescent materials may have characteristics of being relatively vulnerable to external environments such as oxygen and moisture, and thus may be coupled or utilized with functional layers for protecting the luminescent materials.

Meanwhile, foreign substances or contaminants may be introduced into the display device during a process of manufacturing the display device, such as when forming the functional layers or providing and bonding members of the display device, and a luminescent material or the like may be exposed to the external environments by cracks caused by the introduced foreign substances. Accordingly, various techniques for sealing a light emitting element may be utilized. Among them, an encapsulation technique may be utilized in which an encapsulation film is located on a light emitting element to block a penetration path of air and moisture.

The above information disclosed in this Background section is only for enhancement of understanding of the background and therefore the information discussed in this Background section does not necessarily constitute prior art.

SUMMARY

Aspects of some embodiments of the present disclosure herein relate to a display device and a method for manufacturing the same, and for example, to a display device having relatively improved reliability by protecting a light emitting element with an encapsulation-inorganic film having a single-layered structure, and a method for manufacturing the display device.

Some embodiments according to the present disclosure include a display device having relatively improved reliability by including an inorganic film that covers a light emitting element in a pixel unit.

Some embodiments of the present disclosure may also include a method for manufacturing a display device including a method for forming an inorganic film that covers a light emitting element in a pixel unit.

According to some embodiments of the inventive concept, a display device includes: a base layer; a circuit layer on the base layer; a light emitting element including a first electrode on the circuit layer, a functional layer on the first electrode, and a second electrode on the functional layer; a pixel defining film which is on the circuit layer and in which a first pixel opening is defined; a first auxiliary pixel defining film which includes a metal substance and is between the pixel defining film and the circuit layer and in which a second pixel opening is defined; and a second auxiliary pixel defining film which is between the circuit layer and the first auxiliary pixel defining film and in which a third pixel opening, which exposes one surface of the first electrode, is defined, wherein the second electrode is in contact with the first auxiliary pixel defining film.

According to some embodiments, the first auxiliary pixel defining film may include: a first metal layer in which a first opening is defined and which is on the second auxiliary pixel defining film; a second metal layer in which a second opening is defined and which is on the first metal layer; and a third metal layer in which a third opening is defined and which is on the second metal layer.

According to some embodiments, on a cross section perpendicular to the base layer, a width of the second opening may be larger than a width of the first opening and a width of the third opening.

According to some embodiments, each of the first metal layer and third metal layer may include titanium (Ti), and the second metal layer may include aluminum (Al).

According to some embodiments, the display device may further include a sacrificial layer which is between the first electrode and the second auxiliary pixel defining film wherein the sacrificial layer overlaps the first electrode and the second auxiliary pixel defining film on a plane, and a sacrificial layer opening, which exposes one surface of the first electrode, is defined in the sacrificial layer.

According to some embodiments, on a cross section perpendicular to the base layer, a width of the sacrificial layer opening may be larger than a width of the third pixel opening.

According to some embodiments, the functional layer may include: a first sub-functional layer in contact with the first electrode, the sacrificial layer, the second auxiliary pixel defining film, the first metal layer, and the second metal layer; and a second sub-functional layer which is spaced apart from the first sub-functional layer and is in contact with the third metal layer and the pixel defining film, and the second electrode may include a first sub-electrode in contact with the first sub-functional layer and the second metal layer, and a second sub-electrode in contact with the second sub-functional layer.

According to some embodiments, the display device may further include an encapsulation-inorganic film that covers the pixel defining film, the first auxiliary pixel defining film, and the light emitting element.

According to some embodiments, the display device may further include a sensor layer on the encapsulation-inorganic film; and a filling layer between the encapsulation-inorganic film and the sensor layer.

According to some embodiments, the filling layer may overlap the entire surface of each of the pixel defining film and the light emitting element on a plane.

According to some embodiments, the filling layer may not overlap at least a portion of the pixel defining film on a plane.

According to some embodiments, a surface of the encapsulation-inorganic film in contact with the filling layer may be hydrophobic.

According to some embodiments, the display device may further include an auxiliary layer on the encapsulation-inorganic film, wherein the auxiliary layer may include an organic molecule containing a hydrophilic portion adjacent to the encapsulation-inorganic film and a hydrophobic portion spaced apart from the encapsulation-inorganic film.

According to some embodiments, the auxiliary layer may include at least one of tridecafluoro-1,2,2-tetrahydrooctyl trichlorosilane (FOTS), perfluoroodecyltrichlorosilane (FDTS), i-butyltrichlorosilane (IBTCS), decyltrichlorosilane (DTCS), octadecyl trichlorosilane (OTS), octyltrichlorosilane (OTCS), n-dodecyltrichlorosilane (DDTCS), trichloro(n-dodecyl)silane (FNTS), trichloro(3,3,3-trifluoropropyl)silane (FPTS), or methoxy polyethylene glycol silane (mPEGS).

According to some embodiments, the second auxiliary pixel defining film may include an inorganic material.

According to some embodiments of the inventive concept, a display device includes a display panel, a sensor layer on the display panel, and a filling layer between the display panel and the sensor layer, wherein the display panel includes: a base layer; a circuit layer on the base layer; a light emitting element including a first electrode on the circuit layer, a functional layer on the first electrode, and a second electrode on the functional layer; a pixel defining film which is on the circuit layer and in which a first pixel opening, which overlaps the first electrode, is defined; a first auxiliary pixel defining film which includes a metal substance and is between the pixel defining film and the circuit layer and in which a second pixel opening, which overlaps the first electrode, is defined; a second auxiliary pixel defining film which is between the circuit layer and the first auxiliary pixel defining film and in which a third pixel opening, which exposes one surface of the first electrode, is defined; and an encapsulation-inorganic film which covers the light emitting element, the second auxiliary pixel defining film, the first auxiliary pixel defining film, and the pixel defining film.

According to some embodiments, the first auxiliary pixel defining film may include: a first metal layer in which a first opening is defined and which is on the second auxiliary pixel defining film; a second metal layer in which a second opening is defined and which is on the first metal layer; and a third metal layer in which a third opening is defined and which is on the second metal layer.

According to some embodiments, the functional layer may be in contact with the first metal layer and the second metal layer, and the second electrode may be in contact with the second metal layer.

According to some embodiments, on a cross section perpendicular to the base layer, a width of the second opening may be larger than a width of the first opening and a width of the third opening.

According to some embodiments, the sensor layer may include a sensing base layer on the filling layer, a first conductive layer on the sensing base layer, a second conductive layer on the first conductive layer, and a sensing insulation layer between the first conductive layer and the second conductive layer.

According to some embodiments of the inventive concept, a method for manufacturing a display device includes: providing, on a circuit layer, a first electrode and a preliminary sacrificial layer which covers the first electrode; providing a second preliminary auxiliary pixel defining film on a preliminary sacrificial layer; providing a first preliminary auxiliary pixel defining film including a metal on a second preliminary auxiliary pixel defining film; forming a pixel defining film in which a first pixel opening, which exposes a top surface of the first preliminary auxiliary pixel defining film, is defined; patterning the first preliminary auxiliary pixel defining film to form a first auxiliary pixel defining film in which a second pixel opening, which exposes a top surface of the second preliminary auxiliary pixel defining film, is defined; patterning the second preliminary auxiliary pixel defining film to form a second auxiliary pixel defining film in which a third pixel opening, which exposes a top surface of the preliminary sacrificial layer, is defined; patterning the preliminary sacrificial layer to form a sacrificial layer in which a sacrificial layer opening, which exposes a top surface of the first electrode, is defined; providing a functional layer on the exposed top surface of the first electrode; providing a second electrode on the functional layer; and forming an encapsulation-inorganic film which covers the second electrode, the first auxiliary pixel defining film, and the pixel defining film.

According to some embodiments, in the providing of the second electrode, second electrode is in contact with the functional layer and the first auxiliary pixel defining film.

According to some embodiments, the forming of the first preliminary auxiliary pixel defining film may include: forming a first preliminary metal layer on the second preliminary auxiliary pixel defining film; forming a second preliminary metal layer on the first preliminary metal layer; and forming a third preliminary metal layer on the second preliminary metal layer, and the forming of the first auxiliary pixel defining film may include patterning the first preliminary metal layer to form a first metal layer in which a first opening is defined; patterning the second preliminary metal layer to form a second metal layer in which a second opening is defined; and patterning the third preliminary metal layer to form a third metal layer in which a third opening is defined.

According to some embodiments, on a cross section perpendicular to the first electrode, a width of the second opening may be larger than a width of the first opening and a width of the third opening.

According to some embodiments, the providing of the functional layer may include depositing a functional layer forming material on a side surface of the second metal layer at a first angle with respect to a surface parallel to the first electrode, and the providing of the second electrode may include depositing a second electrode forming material on a side surface of the second metal layer at a second angle smaller than the first angle with respect to the surface parallel to the first electrode.

According to some embodiments, on a cross section perpendicular to the first electrode, a width of the sacrificial layer opening may be larger than a width of the third pixel opening.

According to some embodiments, the forming of the encapsulation-inorganic film may include depositing an encapsulation-inorganic material by any one of a chemical vapor deposition method or an atomic layer deposition method.

According to some embodiments, the method may further include surface-treating a top surface of the encapsulation-inorganic film into hydrophobicity.

According to some embodiments, the method may further include: forming a filling layer on the encapsulation-inorganic film; and forming a sensor layer including a sensing base layer, a first conductive layer, a sensing insulation layer, and a second conductive layer on the filling layer.

BRIEF DESCRIPTION OF THE DRAWINGS

The accompanying drawings are included to provide a further understanding of the inventive concept, and are incorporated in and constitute a part of this specification. The drawings illustrate aspects of some embodiments of the inventive concept and, together with the description, serve to explain principles of the inventive concept. In the drawings.

DETAILED DESCRIPTION

Figure 1:
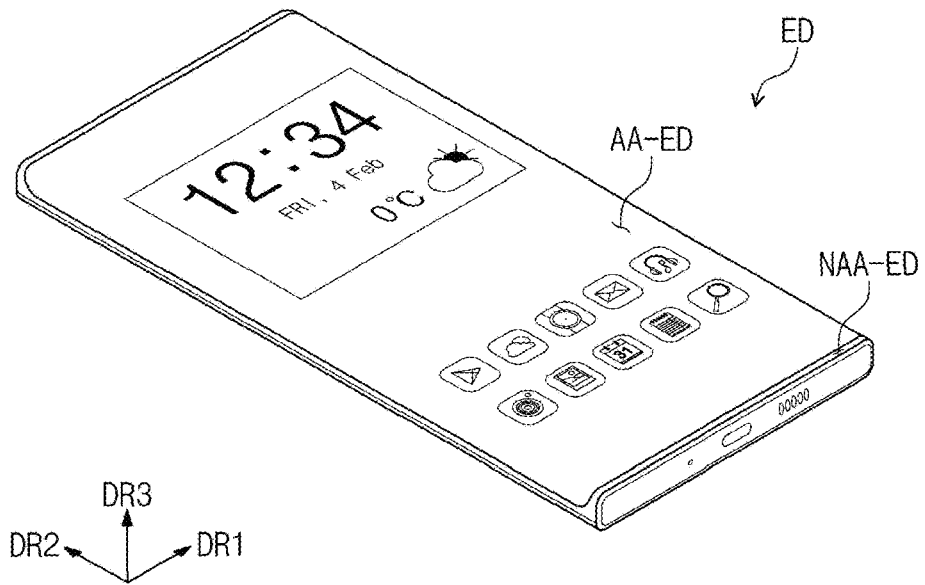
FIG. 1 is an assembled perspective view of a display device according to some embodiments of the inventive concept.

Aspects of some embodiments of the inventive concept may be modified in many alternate forms, and thus specific embodiments will be illustrated in the drawings and described in detail. It should be understood, however, that it is not intended to limit the inventive concept to the particular forms disclosed, but rather, is intended to cover all modifications, equivalents, and alternatives falling within the spirit and scope of the inventive concept.

In the present specification, when a component (or a region, a layer, a portion, etc.) is referred to as being "on," "connected to," or "coupled to" another component, it means that the component may be directly located on/connected to/coupled to the other component, or that a third component may be located therebetween.

Meanwhile, being "directly located on" herein means that there are no intervening layers, films, regions, plates, or the like between a part such as a layer, a film, a region, and a plate and another part. For example, "directly located" may refer to elements that are located adjacent to each other without additional members such as an adhesive member between two layers or two members.

Like reference numerals refer to like components throughout. Also, in the drawings, the thicknesses, ratios, and dimensions of the components are exaggerated for effective description of technical contents. The term "and/or," includes all combinations of one or more of which associated elements may define.

It will be understood that although the terms such as 'first' and 'second' are used herein to describe various elements, these elements should not be limited by these terms. These terms are only used to distinguish one element from another. For example, a first element could be termed a second element, and, similarly, a second element could be termed a first element, without departing from the scope of example embodiments of the inventive concept. The terms of a singular form may include plural forms unless the context clearly indicates otherwise.

Also, terms of "below," "on a lower side," "above," "on an upper side," or the like may be used to describe the relationships of the elements illustrated in the drawings. The terms are used as a relative concept and are described with reference to the direction indicated in the drawings. In the present specification, the expression "located on" may refer to the case of being located on a lower portion of a member as well as the case of being on an upper portion of a member.

It should be understood that the terms "comprise," or "have" are intended to specify the presence of stated features, integers, steps, operations, components, parts, or combinations thereof in the disclosure, but do not preclude the presence or addition of one or more other features, integers, steps, operations, components, parts, or combinations thereof.

Unless otherwise defined, all terms (including technical and scientific terms) used herein have the same meaning as commonly understood by one of ordinary skill in the art to which this invention belongs. In addition, it will be understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device according to some embodiments of the inventive concept will be described with reference to the accompanying drawings.

Figure 2:
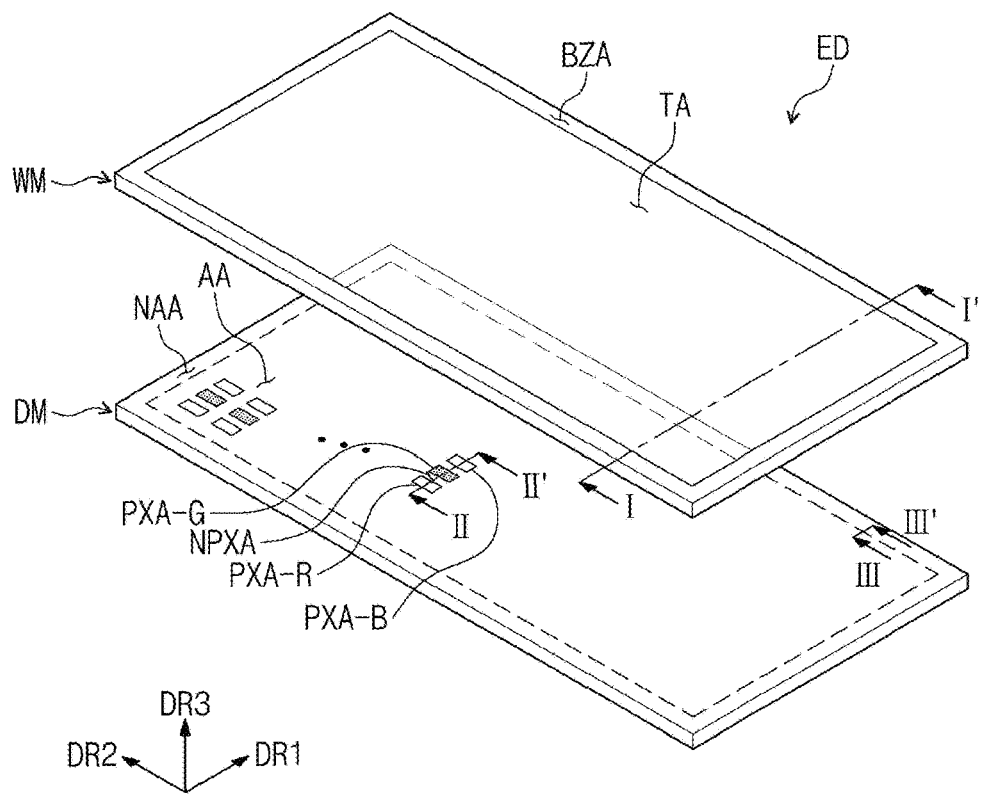
FIG. 2 is an exploded perspective view of the display device according to some embodiments of the inventive concept.
Figure 3:
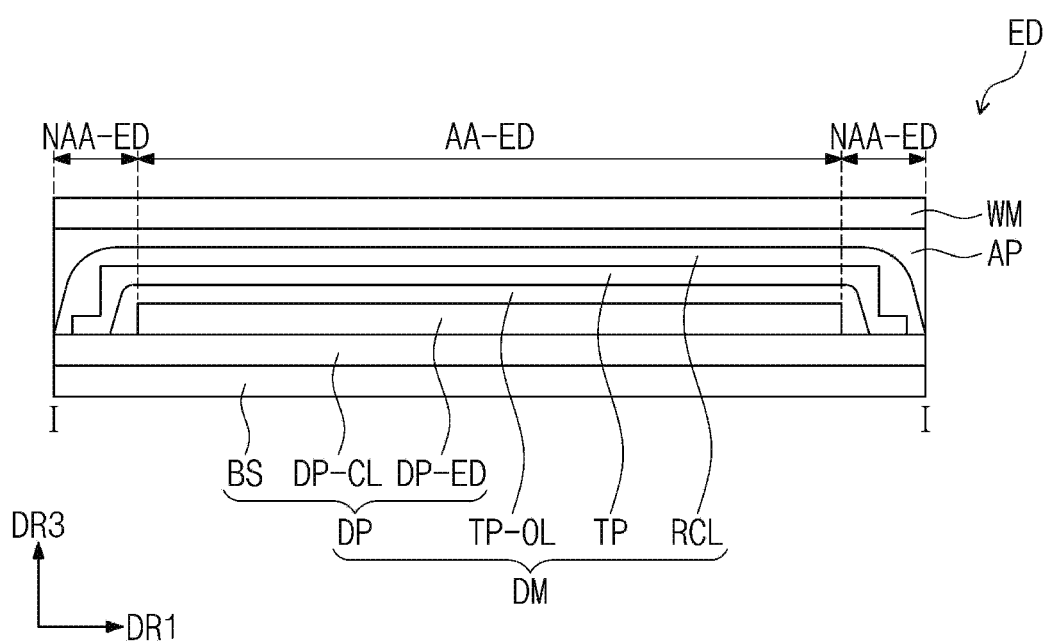
FIG. 3 is a cross-sectional view of the display device according to some embodiments of the inventive concept.

FIG. 1 is an assembled perspective view illustrating a display device according to some embodiments of the inventive concept. FIG. 2 is an exploded perspective view illustrating the display device according to some embodiments of the inventive concept. FIG. 3 is a cross-sectional view of the display device according to some embodiments of the inventive concept; FIG. 3 may be a cross-sectional view taken along the line I-I' of FIG. 2.

The display device ED of embodiments illustrated with respect to FIGS. 1 to 3 may be activated by an electrical signal. For example, the display device ED may be a mobile phone, a tablet, a car navigation device, a game console, or a wearable device, but the embodiments of the inventive concept are not limited thereto. FIG. 1 illustrates an example embodiments in which the display device ED is a mobile phone, but embodiments according to the present disclosure are not limited thereto.

The display device ED according to some embodiments may display images through an active region AA-ED. The active region AA-ED may include a plane defined by a first direction DR1 and a second direction DR2. The active region AA-ED may further include a curved surface bent from at least one side of the plane defined by the first direction DR1 and the second direction DR2. The display device ED according to some embodiments as illustrated in FIG. 1 is illustrated to include two curved surfaces respectively bent from both side surfaces of the plane defined by the first direction DR1 and the second direction DR2. However, the shape of the active region AA-ED is not limited thereto. For example, the active region AA-ED may include only the plane, and the active region AA-ED may further include four curved surfaces respectively bent from at least two or more, for example, four sides of the plane.

A peripheral region NAA-ED is adjacent to the active region AA-ED. The peripheral region NAA-ED may surround the active region AA-ED. Accordingly, the shape of the active region AA-ED may be substantially defined by the peripheral region NAA-ED. However, this is illustrated by way of example, and the peripheral region NAA-ED may be located adjacent to only one side of the active region AA-ED, or may be omitted. The display device ED according to some embodiments of the inventive concept may include active regions having various shapes and is not limited to any one embodiment.

Meanwhile, FIG. 1 and the drawings below illustrate the first direction DR1 to third direction DR3, and the directions indicated by the first to third directions DR1, DR2 and DR3 described in this specification are relative concepts and may be converted into other directions. In this specification, the first direction DR1 and the second direction DR2 are orthogonal to each other, and the third direction DR3 may be a normal line direction with respect to the plane defined by the first direction DR1 and the second direction DR2.

The display device ED may have a thickness direction parallel to a third direction DR3 that is the normal direction with respect to the plane defined by the first direction DR1 and the second direction DR2. In this specification, a front surface (or top surface) and a rear surface (or bottom surface) of members constituting the display device ED may be defined on the basis of the third direction DR3.

The display device ED according to some embodiments may include a display module DM. The display module DM may be a constituent that generates an image and senses an input applied from the outside. The display module DM according to some embodiments includes a display panel DP. The display module DM according to some embodiments may further include a sensor layer TP located on the display panel DP and an optical layer RCL located on the sensor layer TP. The display module DM may include a filling layer TP-OL located between the display panel DP and the sensor layer TP. However, the embodiments of the inventive concept are not limited thereto, and the sensor layer TP or the optical layer RCL may be omitted according to some embodiments.

An active region AA and a peripheral region NAA may be defined in the display module DM. The active region AA may be a region that is activated according to an electrical signal. The peripheral region NAA may be a region that is located to be adjacent to at least one side of the active region AA.

The active region AA may correspond to the active region AA-ED of the display device illustrated in FIG. 1. The peripheral region NAA may be arranged to surround the active region AA. However, the embodiments of the inventive concept are not limited thereto, and a part of the peripheral region NAA according to some embodiments may be omitted unlike the configuration illustrated in FIG. 2, etc. A driving circuit or a driving wiring for driving the active region AA may be located in the peripheral region NAA.

The display device ED according to some embodiments may include a plurality of light emitting regions PXA-R, PXA-G, and PXA-B. For example, the display device ED according to some embodiments may include a first light emitting region PXA-R, a second light emitting region PXA-G, and a third light emitting region PXA-B. According to some embodiments, the first light emitting region PXA-R may be a red light emitting region that emits red light, the second light emitting region PXA-G may be a green light emitting region that emits green light, and the third light emitting region PXA-B may be a blue light emitting region that emits blue light.

When viewed on the plane defined by the first direction DR1 and the second direction DR2, the first light emitting region PXA-R, the second light emitting region PXA-G and the third light emitting region PXA-B may not overlap each other and may be separated. For example, a non-light emitting region NPXA may be located between neighboring light emitting regions PXA-R, PXA-G, and PXA-B.

FIG. 2 illustrates that the light emitting regions PXA-R, PXA-G, and PXA-B in the display device ED according to some embodiments are arranged in a stripe form. That is, in the display device ED according to some embodiments as illustrated in FIG. 2, the first light emitting region PXA-R, the second light emitting region PXA-G, and the third light emitting region PXA-B are alternately arranged in this order along the first direction DR1.

Meanwhile, an arrangement form or shape or configuration of the light emitting regions PXA-R, PXA-G, and PXA-B is not limited to the configuration illustrated in FIG. 2, and the order in which the first light emitting region PXA-R, the second light emitting region PXA-G, and the third light emitting region PXA-B are arranged may be provided in various combinations according to the characteristics of display quality required in the display device ED. For example, the arrangement form of the light emitting regions PXA-R, PXA-G, and PXA-B may be a pentile (PENTILE™) arrangement form or a diamond (Diamond Pixel™) arrangement form.

According to some embodiments, the areas of the light emitting regions PXA-R, PXA-G, and PXA-B which emit light in different wavelength regions among the plurality of light emitting regions PXA-R, PXA-G, and PXA-B may be different from each other. In this case, the areas of the light emitting regions PXA-R, PXA-G, and PXA-B may mean areas when viewed in a plane defined by the first direction DR1 and the second direction DR2. However, the embodiments of the inventive concept are not limited thereto. The light emitting regions PXA-R, PXA-G, and PXA-B may have the same area as each other. In addition, the area ratio may be adjusted variously according to the characteristics of display quality required in the display device ED, and the shape of the light emitting regions PXA-R, PXA-G, and PXA-B on a plane may also be variously deformed and provided.

Meanwhile, FIG. 2 illustrates that each of the light emitting regions PXA-R, PXA-G, and PXA-B has a rectangular shape on a plane, but the embodiments of the inventive concept are not limited thereto, and each of the light emitting regions PXA-R, PXA-G, and PXA-B may have various shapes such as a polygonal shape and a circular shape on a plane.

The display device ED may further include a window WM located on the display module DM. The window WM may cover the entire outside of the display module DM. The window WM may be coupled with the display module DM through an adhesive layer AP.

The window WM may have a shape corresponding to the shape of the display module DM. In the display device ED according to some embodiments, the window WM may include an optically clear insulating material. The window WM may be a glass substrate or polymer substrate. For example, the window WM may be a tempered glass substrate subjected to a tempering treatment.

The window WM may be divided into a transmission part TA and a bezel part BZA. The transmission part TA may correspond to the active region AA of the display module DM, and the bezel part BZA may correspond to a peripheral region NAA of the display module DM. The bezel part BZA may define the shape of the transmission part TA. The bezel part BZA may be adjacent to the transmission part TA, and may surround the transmission part TA. However, the embodiments of the inventive concept are not limited to the illustrated one, and the bezel part BZA may be located adjacent to only one side of the transmission part TA, and a part thereof may be omitted.

In the display device ED according to some embodiments, the display panel DP may include a base layer BS, a circuit layer DP-CL, and a display element layer DP-ED.

The sensor layer TP may be located on the display panel DP. The sensor layer TP may detect an external input applied from the outside. The external input may be a user's input. The user's input may include various types of external inputs such as a portion of a user's body, light, heat, a pen, or a pressure.

In the display device ED according to some embodiments, a filling layer TP-OL may be located between the display panel DP and the sensor layer TP. The filling layer TP-OL may be directly located on the display panel DP. Referring to FIG. 3, the filling layer TP-OL may be provided as a common layer throughout the active region AA-ED, and provided to be extended to the peripheral region NAA-ED. According to some embodiments, the filling layer TP-OL may be a single layer that is commonly arranged in the active region AA-ED and the peripheral region NAA-ED. However, the embodiments of the inventive concept are not limited thereto. For example, the filling layer TP-OL may be provided as a single layer that covers the entire display element layer DP-ED of the display panel DP, or may be provided by being patterned to be located on the display element layer DP-ED, to cover the light emitting regions PXA-R, PXA-G, and PXA-B, and not to overlap a part of the non-light emitting regions NPXA.

In the display module DM according to some embodiments, the sensor layer TP may be formed on the filling layer TP-OL through a continuous process. In this case, the sensor layer TP may be expressed to be directly located on the filling layer TP-OL. The expression "directly located" may mean that a third component is not located between the sensor layer TP and the filling layer TP-OL. That is, a separate adhesive member may not be located between the sensor layer TP and the filling layer TP-OL.

The optical layer RCL may be located on the sensor layer TP. The optical layer RCL may be located above the display panel DP and the sensor layer TP to control being reflected external light in the display panel DP or the sensor layer TP. That is, the optical layer RCL may reduce reflectance of the external light incident from the outside of the display module DM. The optical layer RCL may include, for example, a polarization layer or a color filter layer. Meanwhile, unlike the configuration illustrated in the drawing, the optical layer RCL may be omitted from the display module DM according to some embodiments.

Figure 4A:
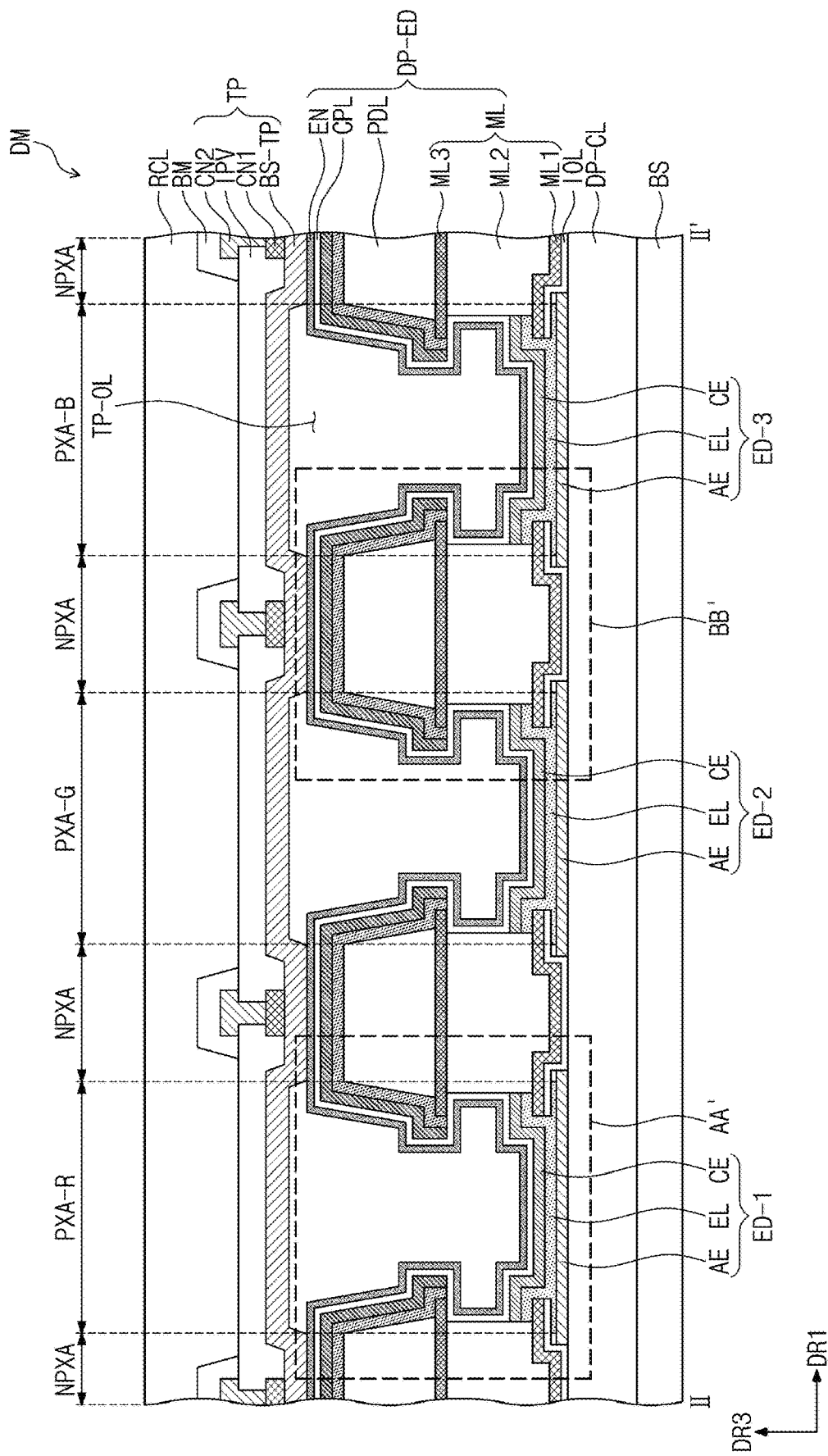
FIG. 4A is a cross-sectional view of a display module according to some embodiments of the inventive concept.
Figure 4B:
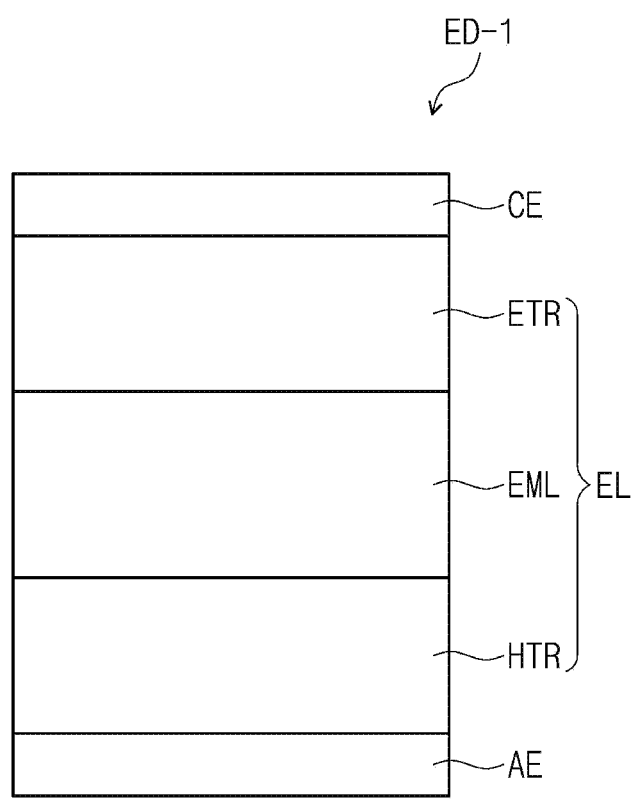
FIG. 4B is a cross-sectional view of a light emitting element according to some embodiments of the inventive concept.
Figure 5A:
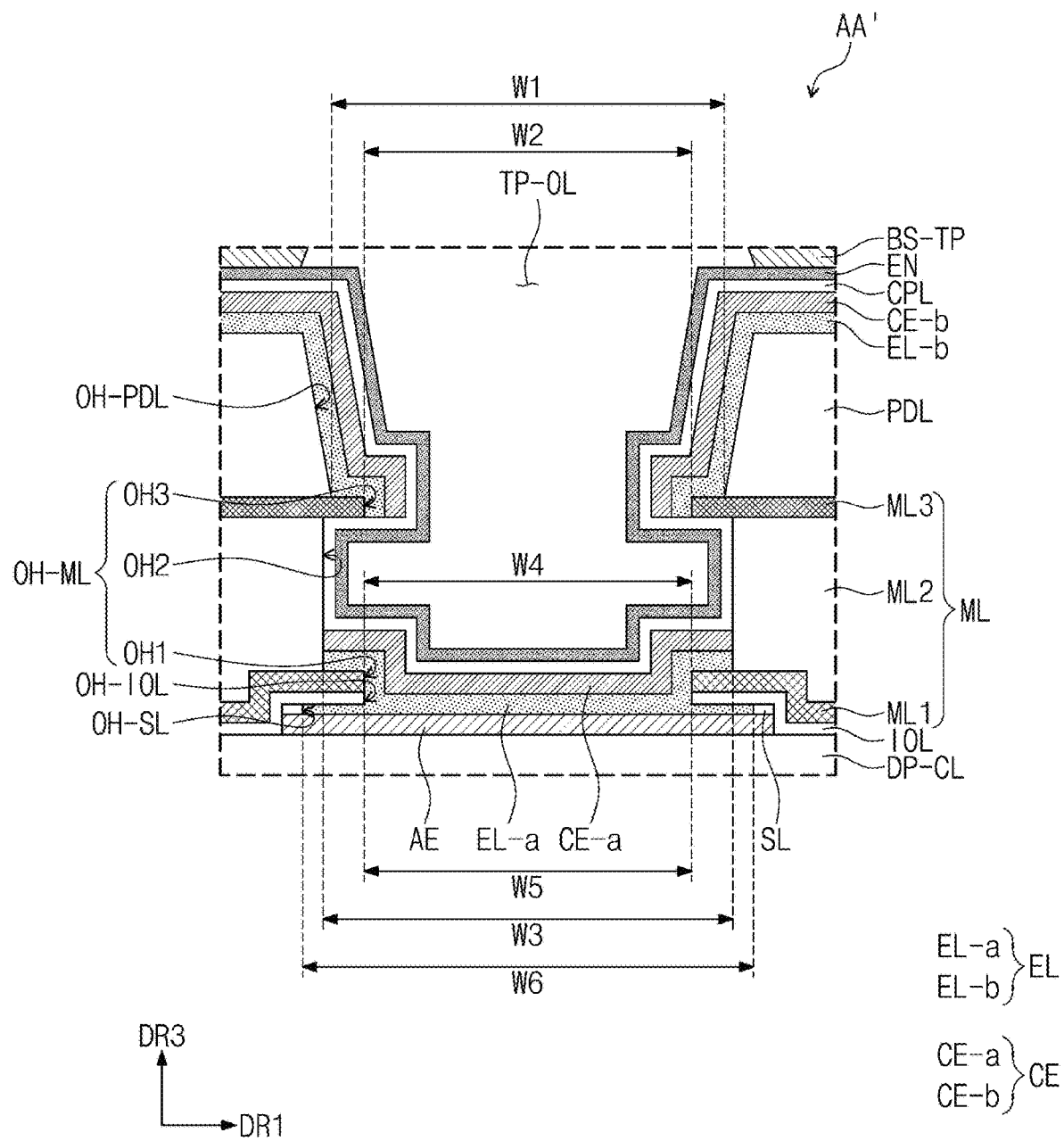
FIG. 5A is a cross-sectional view illustrating a portion of a display module according to some embodiments of the inventive concept.
Figure 5B:
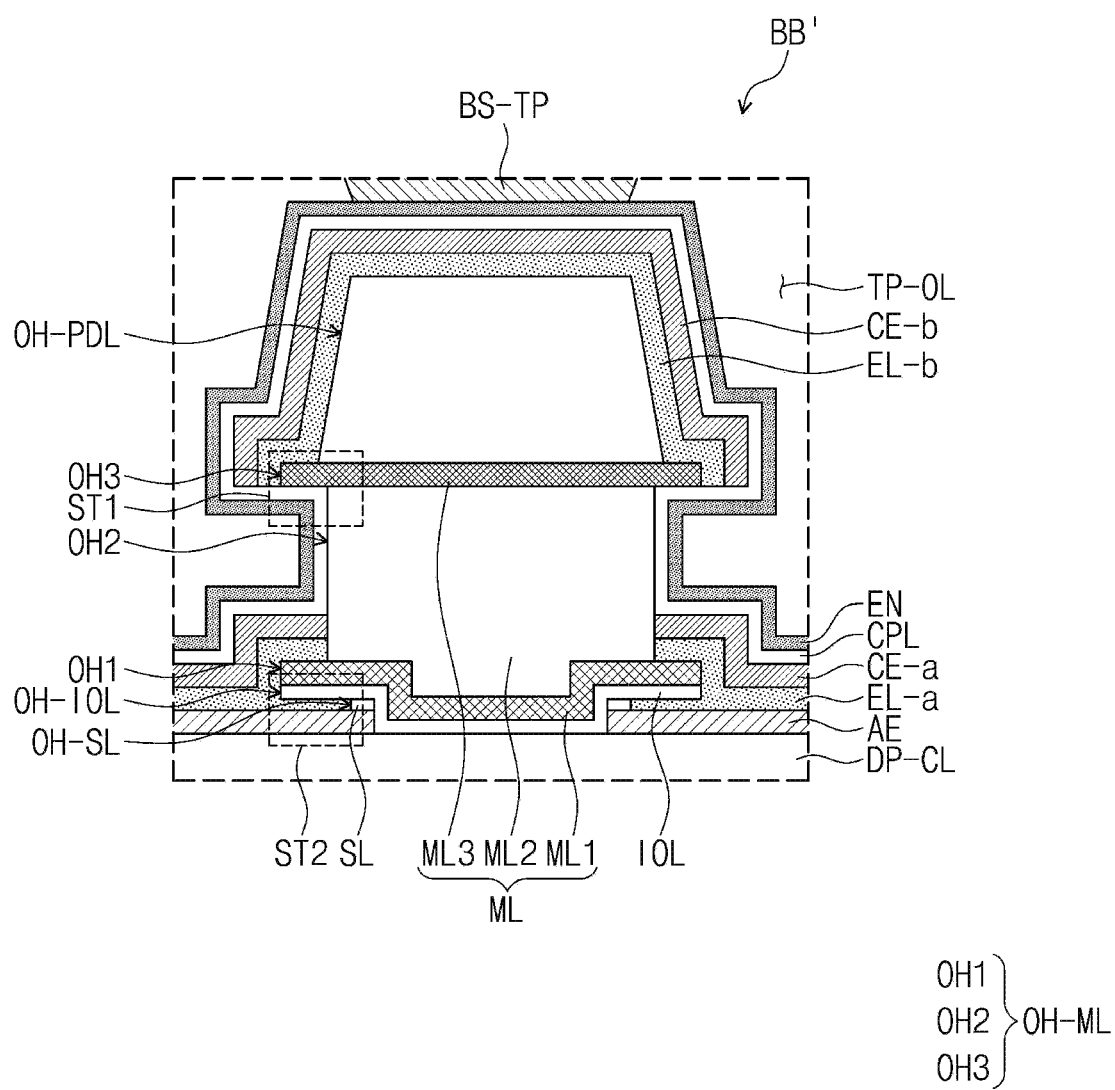
FIG. 5B is a cross-sectional view illustrating a portion of the display module according to some embodiments of the inventive concept.

FIG. 4A is a cross-sectional view of the display module DM according to some embodiments included in the display device ED (see FIG. 2) according to some embodiments. FIG. 4A is a cross-sectional view illustrating a portion taken along the line II-II' of FIG. 2. FIG. 4B is a cross-sectional view of a light emitting element ED-1 (see FIG. 4A) according to some embodiments. FIG. 5A is a cross-sectional view illustrating a portion of a display device according to some embodiments. FIG. 5B is a cross-sectional view illustrating a portion of the display device according to some embodiments. FIG. 5A may be a cross-sectional view illustrating a region AA' in FIG. 4A, and FIG. 5B may be a cross-sectional view illustrating a region BB' in FIG. 4A.

In the display module DM according to some embodiments, the display panel DP includes light emitting elements ED-1, ED-2, and ED-3. The display panel DP may be divided into a pixel defining film PDL, a second auxiliary pixel defining film IOL, or a first auxiliary pixel defining film ML, and include a plurality of light emitting elements ED-1, ED-2, and ED-3 corresponding to the first light emitting region PXA-R, the second light emitting region PXA-G and third light emitting region PXA-B.

In the display module DM according to some embodiments, the display panel DP may be a light emitting type display panel. For example, the display panel DP may be an organic electroluminescence display panel. When the display panel DP is an organic electroluminescence display panel, the display element layer DP-ED may include an organic electroluminescence element.

However, the embodiments of the inventive concept are not limited thereto. For example, the display element layer DP-ED may include quantum dot light emitting elements as the light emitting elements ED-1, ED-2, and ED-3. In addition, the display element layer DP-ED may include micro LED elements and/or nano LED elements as the light emitting elements ED-1, ED-2, and ED-3.

In the display panel DP, the base layer BS may be a member which provides a base surface on which the display element layer DP-ED is located. The base layer BS may be a glass substrate, a metal substrate, a polymer substrate, or the like. However, the embodiments of the inventive concept are not limited thereto, and the base layer BS may be an inorganic layer, a functional layer, or a composite material layer.

The base layer BS may have a multi-layered structure. For example, the base layer BS may have a three-layered structure constituted by a polymer resin layer, an adhesive layer, and a polymer resin layer. Particularly, the polymer resin layer may include a polyimide-based resin. Also, the polymer resin layer may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. In this specification, the term "~~based" resin represents a feature of including a functional group of "~~".

According to some embodiments, the circuit layer DP-CL is located on the base layer BS, and the circuit layer DP-CL may include a plurality of transistors. Each of the transistors may include a control electrode, an input electrode, and an output electrode. For example, the circuit layer DP-CL may include a switching transistor and a driving transistor for driving the light emitting elements ED-1, ED-2, and ED-3 of the display element layer DP-ED.

The circuit layer DP-CL may include an insulation layer, a semiconductor pattern, a conductive pattern, a signal line, etc. The insulation layer, the semiconductor layer, and the conductive layer may be formed on the base layer BS in a manner such as coating or vapor deposition, and then, the insulation layer, the semiconductor layer, and the conductive layer may be optionally patterned through a plurality of photolithography processes. Thereafter, the semiconductor pattern, the conductive pattern, and the signal line, which are contained in the circuit layer DP-CL, may be formed.

According to some embodiments, the circuit layer DP-CL may include a transistor, a buffer layer, and a plurality of insulation layers.

On the circuit layer DP-CL, the display element layer DP-ED including the light emitting elements ED-1, ED-2, and ED-3 is located. The display element layer DP-ED may include the first auxiliary pixel defining film ML, the second auxiliary pixel defining film IOL, the pixel defining film PDL, the light emitting elements ED-1, ED-2, and ED-3, and an encapsulation-inorganic film EN.

Each of the light emitting elements ED-1, ED-2, and ED-3 may include a first electrode AE, a functional layer EL, and a second electrode CE.

Referring to FIG. 4B, the light emitting element ED-1 according to some embodiments may include the first electrode AE, the functional layer EL, and the second electrode CE, and the functional layer EL may include a hole transport region HTR, an emission layer EML, and an electron transport region ETR. FIG. 4B illustrates a first light emitting element ED-1 corresponding to the first light emitting region PXA-R, but a stacked structure of the first light emitting element ED-1 may be equally applied to a second light emitting element ED-2 and a third light emitting element ED-3. However, the constitution of the functional layers EL of the first to third light emitting elements ED-1, ED-2, and ED-3 may be different from each other. For example, the first to third light emitting elements ED-1, ED-2, and ED-3 may have a different constitution of the emission layer EML.

Each emission layer EML of the light emitting elements ED-1, ED-2, and ED-3 separated to correspond to the light emitting regions PXA-R, PXA-G, and PXA-B may emit blue light or may emit light in different wavelength regions. For example, the emission layer of the first light emitting element ED-1 may emit red light, the emission layer of the second light emitting element ED-2 may emit green light, and the emission layer of the third light emitting element ED-3 may emit blue light. However, the embodiments of the inventive concept are not limited thereto, and wavelengths of light emitted from the first to third light emitting elements ED-1, ED-2, and ED-3 may be variously combined according to display quality required in the display device.

Hereinafter, the description will be done with reference to the first light emitting element ED-1 illustrated in FIGS. 5A and 5B, and the description of the first light emitting element ED-1 may be equally applied to the second and third light emitting elements ED-2 and ED-3 except for the configuration of the emission layer.

In the light emitting element ED-1, the first electrode AE may be an anode or a cathode. In addition, the first electrode AE may be a pixel electrode. The first electrode AE may be a transmissive electrode, a transflective electrode, or a reflective electrode. When the first electrode AE is the transmissive electrode, the first electrode AE may include a transparent metal oxide such as indium tin oxide (ITO), indium zinc oxide (IZO), zinc oxide (ZnO), and indium tin zinc oxide (ITZO). When the first electrode AE is the transflective electrode or the reflective electrode, the first electrode AE may include Ag, Mg, Cu, Al, Pt, Pd, Au, Ni, Nd, Ir, Cr, Li, Ca, LiF/Ca, LiF/Al, Mo, Ti, W, a compound thereof, or a mixture thereof (e.g., a mixture of Ag and Mg). Alternatively, the first electrode AE may have a multilayer structure including a reflective film or a transflective film formed of the above-described materials, and a transparent conductive film formed of ITO, IZO, ZnO, ITZO, etc. For example, the first electrode AE may have a three-layered structure of ITO/Ag/ITO, but the embodiments of the inventive concept are not limited thereto.

The hole transport region HTR may be located between the first electrode AE and the emission layer EML. According to some embodiments, the hole transport region HTR may include at least one of a hole injection layer, a hole transport layer, or an electron blocking layer.

The hole transport region HTR may include a phthalocyanine compound such as copper phthalocyanine; $N^1,N^{1'}$-([1,1'-biphenyl]-4,4'-diyl)bis($N^1$-phenyl-$N^4,N^4$-di-m-tolyl-benzene-1,4-diamine) (DNTPD), 4,4',4''-[tris(3-methylphenyl)phenylamino] triphenylamine (m-MTDATA), 4,4'4''-tris(N,N-diphenylamino)triphenylamine (TDATA), 4,4',4''-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], dipyrazino[2,3-f: 2',3'-h]quinoxaline-2,3,6,7,10,11-hexacarbonitrile (HATCN), etc.

The hole transport region HTR may include a carbazole-based derivative such as N-phenyl carbazole or polyvinyl carbazole, a fluorene-based derivative, a triphenylamine-based derivative such as N,N'-bis(3-methylphenyl)-N,N'-diphenyl-[1,1-biphenyl]-4,4'-diamine (TPD) or 4,4',4''-tris(N-carbazolyl)triphenylamine (TCTA), N,N'-di(naphthalene-1-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis(N-carbazolyl)benzene (mCP), etc.

The emission layer EML is located on the hole transport region HTR. The emission layer EML may have a single layer formed of a single material, a single layer formed of a plurality of different materials, or a multilayer structure having a plurality of layers formed of a plurality of different materials.

The emission layer EML may include a fluorescent or phosphorescent material. In the light emitting element according to some embodiments, the emission layer EML may include an anthracene derivative, a pyrene derivative, a fluoranthene derivative, a chrysene derivative, a dehydrobenzanthracene derivative, or a triphenylene derivative. In addition, the emission layer EML may include an organometallic complex as a luminescent material. Meanwhile, the emission layer EML may also include a quantum dot as a luminescent material.

The electron transport region ETR may be located between the emission layer EML and the second electrode CE. According to some embodiments, the electron transport region ETR may include at least one of an electron injection layer, an electron transport layer, or a hole blocking layer.

The electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-

(1,1'-biphenyl-4-olato)aluminum (BAlq), beryllium bis(benzoquinolin-10-olate (Bebq$_2$), 9,10-di(naphthalene-2-yl) anthracene (ADN), 1,3-bis[3,5-di(pyridin-3-yl)phenyl] benzene (BmPyPhB), or a mixture thereof.

In addition, the electron transport regions ETR may include a metal halide such as LiF, NaCl, CsF, RbCl, RbI, CuI, or KI, a lanthanide metal such as Yb, and a co-deposited material of the metal halide and the lanthanide metal. For example, the electron transport region ETR may include KI:Yb, RbI:Yb, etc. as a co-deposited material. Meanwhile, the electron transport region ETR may be formed using a metal oxide such as Li$_2$O or BaO, or 8-hydroxyl-lithium quinolate (Liq), etc., but the embodiments of the inventive concept are not limited thereto. The electron transport region ETR may also be formed of a mixture material of an electron transport material and an insulating organometallic salt.

The second electrode CE is provided on the electron transport region ETR. The second electrode CE may be a common electrode. The second electrode CE may be a cathode or an anode, but the embodiments of the inventive concept are not limited thereto. For example, when the first electrode AE is an anode, the second electrode CE may be a cathode, and when the first electrode AE is a cathode, the second electrode CE may be an anode.

The second electrode CE may be a transmissive electrode, a transflective electrode, or a reflective electrode. When the second electrode CE is the transmissive electrode, the second electrode CE may be formed of a transparent metal oxide such as ITO, IZO, ZnO, or ITZO.

Referring to FIGS. 4A to 5B, in the display module DM according to some embodiments, the light emitting elements ED-1, ED-2, and ED-3 may be divided by the second auxiliary pixel defining film IOL, the first auxiliary pixel defining film ML, and the pixel defining film PDL. The second auxiliary pixel defining film IOL, the first auxiliary pixel defining film ML, and the pixel defining film PDL may correspond to the non-light emitting region NPXA. The first auxiliary pixel defining film ML is located between the pixel defining film PDL and the circuit layer DP-CL. The second auxiliary pixel defining film IOL is located between the first auxiliary pixel defining film ML and the circuit layer DP-CL.

A first pixel opening OH-PDL is defined in the pixel defining film PDL, a second pixel opening OH-ML is defined in the first auxiliary pixel defining film ML, and a third pixel opening OH-IOL is defined in the second auxiliary pixel defining film IOL. The first pixel opening OH-PDL, the second pixel opening OH-ML, and the third pixel opening OH-IOL may correspond to the light emitting regions PXA-R, PXA-G, and PXA-B.

The second auxiliary pixel defining film IOL may be located on the circuit layer DP-CL. The second auxiliary pixel defining film IOL may be directly located on the circuit layer DP-CL. The second auxiliary pixel defining film IOL may include an inorganic material. For example, the second auxiliary pixel defining film IOL may include silicon nitride, silicon oxide, silicon oxynitride, or the like. The third pixel opening OH-IOL, which exposes one surface of the first electrode AE is defined in the second auxiliary pixel defining film IOL. One surface of the first electrode AE may be exposed by the third pixel opening OH-IOL.

The first auxiliary pixel defining film ML may be located on the second auxiliary pixel defining film IOL. The first auxiliary pixel defining film ML may be directly located on the second auxiliary pixel defining film IOL. The first auxiliary pixel defining film ML may include a metal material. For example, the first auxiliary pixel defining film ML may include molybdenum, silver, titanium, copper, aluminum, or an alloy thereof.

The first auxiliary pixel defining film ML may have a single layered structure or a multi-layered structure, for example a three-layered structure. According to some embodiments, the first auxiliary pixel defining film ML may include a first metal layer ML1 which is located on the second auxiliary pixel defining film IOL, a second metal layer ML2 which is located on the first metal layer ML1, and a third metal layer ML3 which is located on the second metal layer ML2. Each of the first metal layer ML1 and the third metal layer ML3 may include titanium, and the second metal layer ML2 may include aluminum. However, the embodiments of the inventive concept are not limited thereto. A first opening OH1 is defined in first metal layer ML1, a second opening OH2 is defined in the second metal layer ML2, and a third opening OH3 is defined in the third metal layer ML3.

When the first auxiliary pixel defining film ML has the three-layered structure, the second pixel opening OH-ML may include the first opening OH1, the second opening OH2, and the third opening OH3. On a plane, each of the first opening OH1, the second opening OH2, and the third opening OH3 may overlap the first electrode AE. One surface of the first electrode AE may be exposed by each of the first opening OH1, the second opening OH2, and the third opening OH3.

The pixel defining film PDL may be located on the first auxiliary pixel defining film ML. For example, the pixel defining film PDL may be directly located on the third metal layer ML3.

According to some embodiments, the pixel defining film PDL may be formed of a polymer resin. For example, the pixel defining film PDL may include a polyacrylate-based resin or a polyimide-based resin. In addition, the pixel defining film PDL may further include an inorganic material in addition to the polymer resin. Meanwhile, the pixel defining films PDL may include a light absorbing material or a black pigment or a black dye. The pixel defining film PDL including the black pigment or the black dye may implement a black pixel defining film. In forming the pixel defining film PDL, carbon black, etc. may be used as the black pigment or the black dye, but the embodiments of the inventive concept are not limited thereto.

The first pixel opening OH-PDL may be defined in the pixel defining film PDL. One surface of the first electrode AE may be exposed by the first pixel opening OH-PDL.

On a cross-section perpendicular to the base layer BS, it is illustrated that a width W1 of the first pixel opening OH-PDL is larger than a width W2 of the third opening OH3. However, the embodiments of the inventive concept are not limited thereto, the width W1 of the first pixel opening OH-PDL may be substantially equal to the width W2 of the third opening OH3. In the specification, the expression "substantially equal" means the equal including errors that may occur in processes or in general.

On a cross-section perpendicular to the base layer BS, a width W3 of the second opening OH2 may be larger than a width W4 of the first opening OH1 and the width W2 of the third opening OH3.

A first stepped part ST1 having an undercut shape is defined by a difference in the width between the second opening OH2 and the third opening OH3.

Meanwhile, in the specification, the light emitting regions PXA-R, PXA-G, and PXA-B are defined to correspond to a partial region of the first electrode AE exposed by a sacrificial layer opening OH-SL.

A sacrificial layer SL and the functional layer EL may be located on the first electrode AE. The sacrificial layer SL may include a transparent metal oxide. For example, the sacrificial layer SL may include at least one of indium zinc oxide (IZO) or indium gallium zinc oxide (IGZO). The sacrificial layer opening OH-SL which exposes one surface of the first electrode AE may be defined in the sacrificial layer SL.

On a cross-section perpendicular to the base layer BS, the width W6 of the sacrificial layer opening OH-SL may be larger than the width W5 of the third pixel opening OH-IOL defined in the second auxiliary pixel defining film IOL. A second stepped part ST2 is defined by a difference in the width between the third pixel opening OH-IOL and the sacrificial layer opening OH-SL.

The functional layer EL may be located on one surface of the first electrode AE which is exposed by the sacrificial layer opening OH-SL. The functional layer EL may include a first sub-functional layer EL-a and a second sub-functional layer EL-b. The first sub-functional layer EL-a is a part which is located in the sacrificial layer opening OH-SL, the third pixel opening OH-IOL, the first opening OH1, and the second opening OH2. The second sub-functional layer EI-b is a part which is not connected to the first sub-functional layer EL-a and is located in the third opening OH3 and the first pixel opening OH-PDL. The first sub-functional layer EL-a may cover the side surface of the first metal layer ML1 and be in contact with the side surface of the second metal layer ML2. At least a portion of the side surface of the second metal layer ML2 may be exposed from the first sub-functional layer EL-a. This is a shape of the functional layer EL in a process according to some embodiments, and the embodiments of the inventive concept are not limited thereto. For example, the functional layer EL may not in contact with the second metal layer ML2.

Referring to FIG. 5B, the first stepped part ST1 may have an undercut shape concave towards the second metal layer ML2. The first stepped part ST1 may be a part formed by a difference in position between the edge of the third metal layer ML3 and the edge of the second metal layer ML2. The second stepped part ST2 may have an undercut shape concave towards the sacrificial layer opening OH-SL. The second stepped part ST2 may be a part formed by a difference in position between the edge of the second auxiliary pixel defining film IOL and the edge of the sacrificial layer SL.

That is, the display module DM according to some embodiments may include at least two stepped parts ST1 and ST2 having an undercut shape below the pixel defining film PDL. The edges of the first electrode AE, the functional layer EL, and the second electrode CE are located in the first stepped part ST1 having an undercut shape defined below the pixel defining film PDL, and thus the components of the light emitting elements ED-1, ED-2, and ED-3 in the light emitting regions PXA-R, PXA-G, and PXA-B may be effectively protected by using an encapsulation-inorganic film EN which will be described later.

Referring to FIGS. 5A and 5B together, according to some embodiments, the first sub-functional layer EL-a may be arranged to be in contact with the first electrode AE, the sacrificial layer SL, the second auxiliary pixel defining film IOL, the first metal layer ML1, and the second metal layer ML2, and the second sub-functional layer EL-b may be arranged to be spaced apart for the first sub-functional layer EL-a and be in contact with the third metal layer ML3 and the pixel defining film PDL. The second sub-functional layer EL-b may surround the side surface of the third metal layer ML3 defining the third opening OH3, the top surface of the third metal layer ML3 exposed by the first pixel opening OH-PDL, and the top surface and side surface of the pixel defining film PDL.

Referring to FIGS. 4, 5A, and 5B together, the functional layer EL may include the hole transport region HTR, the emission layer EML, and the electron transport region ETR. For example, the first sub-functional layer EL-a may include the hole transport region HTR, the emission layer EML, and the electron transport region ETR. The second sub-functional layer EL-b may include the hole transport region HTR and the electron transport region ETR. According to some embodiments, the second sub-functional layer EL-b may not include the emission layer EML. However, the embodiments of the inventive concept are not limited thereto, and the second sub-functional layer EL-b may include another part of the emission layer EML which is not connected with the emission layer EML of the first sub-functional layer EL-a.

When the functional layer EL is formed, a part in which the functional layer EL is not provided may be generated in the first auxiliary pixel defining film ML by the first stepped part ST1. Thus, the first sub-functional layer EL-a may not be connected with the second sub-functional layer EL-b. An edge part EG-EL of the first sub-functional layer EL-a may be in contact with the side surface of the second metal layer ML2 defining the second opening OH2. The exposed surface of the first sub-functional layer EL-a may be covered and protected by the second electrode CE.

According to some embodiments, the second electrode CE of the light emitting element ED-1 may include a first sub-electrode CE-a and a second sub-electrode CE-b. The first sub-electrode CE-a may be a part which is located in the first opening OH1 and the second opening OH2, and the second sub-electrode CE-b may be a part which is not connected with the first sub-electrode CE-a and is located on the second sub-functional layer EL-b. According to some embodiments, the first sub-electrode CE-a is located on the first sub-functional layer EL-a.

When the second electrode CE is formed, a part in which the second electrode CE is not provided may be generated in the first auxiliary pixel defining film ML by the first stepped part ST1. The first sub-electrode CE-a may not be connected with the sub-second electrode CE-b. An edge part EG-CE of the first sub-electrode CE-a is in contact with the side surface of the second metal layer ML2 defining the second opening OH2. Thus, for the display module DM of the inventive concept, although the first sub-electrode CE-a is not connected to the second sub-electrode CE-b, the first sub-electrodes CE-a located in the light emitting regions PXA-R, PXA-G, and PXA-B may be electrically connected to each other via the second metal layer ML2, and the display module DM may have the same effect as the first sub-electrodes CE-a are provided as a common layer.

In addition, the display module DM includes the first auxiliary pixel defining film ML containing a metal material below the pixel defining film PDL, and the first sub-electrode CE-a is in contact with the first auxiliary pixel defining film ML, and thus the functional layer EL may be protected from foreign substances of an upper portion of the pixel defining film PDL or moisture permeation due to a pit of the pixel defining film PDL during a process of forming the light emitting elements ED-1, ED-2, and ED-3, and the reliability of the display module DM may be improved.

Meanwhile, in the display module DM according to some embodiments, the sum of the thickness of the sacrificial layer SL and the thickness of the second auxiliary pixel defining film IOL may be smaller than the thickness of the functional layer EL. Thus, the edge part EG-CE of the first sub-electrode CE-a may be in contact with the side surface of the second metal layer ML2 defining the second opening OH2.

The display module DM according to some embodiments may include the encapsulation-inorganic film EN located on the light emitting elements ED-1, ED-2, and ED-3. The encapsulation-inorganic film EN may generally cover the pixel defining film PDL, the first auxiliary pixel defining film ML, and the light emitting elements ED-1, ED-2, and ED-3. Referring to FIG. 4A, the encapsulation-inorganic film EN may be provided as a common layer throughout the light emitting regions PXA-R, PXA-G, PXA-B and non-light emitting regions NPXA.

The encapsulation-inorganic film EN may cover the top surface of the first sub-electrode CE-a, the side surface of the second metal layer ML2 defining the second opening OH2, the bottom surface of the third metal layer ML3 exposed by the second opening OH2, the edge of the second sub-functional layer EL-b, the edge of the second sub-electrode CE-b, and the top surface of the second sub-electrode CE-b.

The encapsulation-inorganic film EN may serve as a barrier layer which protects the light emitting elements ED-1, ED-2, and ED-3 from moisture/oxygen. The encapsulation-inorganic film EN may include at least one of silicon nitride, silicon oxynitride, or silicon oxide. In addition, according to some embodiments, the encapsulation-inorganic film EN may further include titanium oxide or aluminum oxide, but the embodiments of the inventive concept are not limited thereto. Meanwhile, according to some embodiments, the encapsulation-inorganic film EN may be formed by a chemical vapor deposition method, or an atomic layer deposition method using an inorganic material such as silicon nitride.

The display module DM of the inventive concept includes the first stepped part ST1 having an undercut shape, and thus the peel strength of the encapsulation-inorganic film EN may be increased and adhesion of the encapsulation-inorganic film EN may be improved. For example, the peel strength of the encapsulation-inorganic film EN may be about 20 gf/inch or more. Thus, the display module DM may effectively protect the components of the light emitting element such as the first sub-functional layer EL-a and the second sub-functional layer EL-b.

In addition, according to some embodiments, the display module DM may further include a capping layer CPL located below the encapsulation-inorganic film EN. The capping layer CPL may be located between the second electrode CE and the encapsulation-inorganic film EN, or between the second metal layer ML2 and the encapsulation-inorganic film EN. The capping layer CPL may increase light extraction efficiency of the light emitting elements ED-1, ED-2, and ED-3. However, the embodiments of the inventive concept are not limited thereto, and the capping layer CPL may be omitted.

The display module DM according to some embodiments includes a stacked configuration of the capping layer CPL and the encapsulation-inorganic film EN, and thus the light emitting elements ED-1, ED-2, and ED-3 may be effectively protected from moisture/oxygen, and improved light extraction efficiency may be exhibited simultaneously.

The display module DM according to some embodiments may include the filling layer TP-OL located on the display element layer DP-ED. The filling layer TP-OL may fill a part, in which the light emitting elements ED-1, ED-2, and ED-3, the encapsulation-inorganic film EN, the capping layer CPL, etc. are not located, among the opening regions defined in the display element layer DP-ED.

The filling layer TP-OL may be located on the encapsulation-inorganic film EN. According to some embodiments, the filling layer TP-OL may be directly located on the encapsulation-inorganic film EN. In the display module DM according to some embodiments, the filling layer TP-OL may fill a space between the display panel DP and the sensor layer TP.

The filling layer TP-OL may be provided by being patterned to overlap the light emitting regions PXA-R, PXA-G, and PXA-B and not to overlap a part of the non-light emitting regions NPXA. The filling layer TP-OL may be patterned not to overlap at least a part of the pixel defining film PDL.

The filling layer TP-OL may cover the encapsulation-inorganic film EN, and may fill the third opening OH3, the first pixel opening OH-PDL, and a part of the second opening OH2. The sensor layer TP may be directly located on a part of the encapsulation-inorganic film EN which is not covered by the filling layer TP-OL. For example, a sensing base layer BS-TP may be directly located on the top surface of the encapsulation-inorganic film EN which is not covered by the filling layer TP-OL and exposed.

The filling layer TP-OL may include an organic polymer material. For example, the filling layer TP-OL may be formed of an acrylate-based resin, an imide-based resin, or the like. The filling layer TP-OL may include an acrylate-based polymer, an imide-based polymer, or the like.

Meanwhile, one surface of the encapsulation-inorganic film EN in contact with the filling layer TP-OL may be surface-treated into hydrophobicity. Thus, during the process of forming the filling layer TP-OL on the encapsulation-inorganic film EN, moisture permeation may be minimized with the encapsulation-inorganic film EN, and the light emitting elements ED-1, ED-2, and ED-3 may be effectively protected.

The display module DM according to some embodiments may include the sensor layer TP located above the filling layer TP-OL. According to some embodiments, the sensor layer TP may be directly located on the filling layer TP-OL. The sensor layer TP may be referred to as a sensor, an input sensing layer, or an input sensing panel. The sensor layer TP may include the sensing base layer BS-TP, a first conductive layer CN1, a sensing insulation layer IPV, and a second conductive layer CN2.

The sensing base layer BS-TP may be directly located on the filling layer TP-OL. The sensing base layer BS-TP may be an inorganic layer including at least one of silicon nitride, silicon oxynitride, or silicon oxide. Alternatively, the sensing base layer BS-TP may be an organic layer including an epoxy resin, an acrylic resin, or an imide-based resin. The sensing base layer may have a single-layered structure or a multi-layered structure in which a plurality of layers are stacked in the third direction DR3.

Each of the first conductive layer CN1 and the second conductive layer CN2 may have a single-layered structure or a multi-layered structure in which a plurality of layers are stacked in the third direction DR3. The conductive layer having the single-layered structure may include a metal layer or a transparent conductive layer. The metal layer may include molybdenum, silver, titanium, copper, aluminum, or an alloy thereof. The transparent conductive layer may include transparent conductive oxide such as indium tin oxide (ITO), indium zinc oxide (IZO), zinc oxide (ZnO), zinc peroxide ($ZnO_2$), or indium zinc tin oxide (IZTO). In addition, the transparent conductive layer may include a conductive polymer such as PEDOT, a metal nanowire, graphene, etc.

The conductive layer having the multi-layered structure may include metal layers. The metal layers may have a three-layered structure of titanium/aluminum/titanium. The conductive layer having the multi-layered structure may include at least one metal layer and at least one transparent conductive layer.

The sensing insulation layer IPV may be located between the first conductive layer CN1 and the second conductive layer CN2. The sensing insulation layer IPV may include an inorganic film. The inorganic film may include at least one of aluminum oxide, titanium oxide, silicon oxide, silicon nitride, silicon oxynitride, zirconium oxide, or hafnium oxide.

Alternatively, the sensing insulation layer IPV may include an organic film. The organic film may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

According to some embodiments, the display module DM may further include the optical layer RCL located on the sensor layer TP. For example, the optical layer RCL may be formed on the sensor layer TP through a continuous process. However, the embodiments of the inventive concept are not limited thereto.

The optical layer RCL may include a pigment or a dye. In addition, according to some embodiments, the optical layer RCL may include a plurality of filters which transmit light in different wavelength regions. Each of the filters which transmit light in different wavelength regions may be arranged to correspond to each of the light emitting regions PXA-R, PXA-G, and PXA-B that are divided by the non-light emitting regions NPXA.

The optical layer RCL may further include a dividing pattern BM. A material constituting the dividing pattern BM is not specifically limited as long as it is a material that absorbs light. The dividing pattern BM is a black layer, and according to some embodiments, the dividing pattern BM may include a black coloring agent. The black coloring agent may include a black dye and a black pigment. The black coloring agent may include carbon black, a metal such as chromium, or an oxide thereof.

The dividing pattern BM may cover the second conductive layer CN2 of the sensor layer TP. The dividing pattern BM may prevent the external light reflection by the second conductive layer CN2.

Alternatively, the optical layer RCL may include a reflection adjustment layer located on the dividing pattern BM, instead of the plurality of filters. The reflection adjustment layer may optionally absorb light in some bands among light reflected inside the display panel and/or display device, or incident light from the outside of the display panel and/or display device. For example, the reflection adjustment layer may absorb light in a first wavelength region of about 490 nm to about 505 nm and in a second wavelength region of about 585 nm to 600 nm, and thus a light transmittance in the first wavelength region and the second wavelength region may be about 40% or less.

The reflection adjustment layer may be provided as an organic layer including a dye, a pigment, or a combination thereof. The reflection adjustment layer may include a tetra aza porphyrin (TAP)-based compound, a porphyrin-based compound, a metal porphyrin-based compound, an oxazine-based compound, a squarylium-based compound, a triarylmethane-based compound, a polymethine-based compound, an anthraquinone-based compound, a phthalocyanine-based compound, an azo-based compound, a perylene-based compound, a xanthene-based compound, a diimmonium-based compound, a dipyrromethene-based compound, a cyanine-based compound, or a combination thereof.

According to some embodiments, the reflection adjustment layer may have a transmittance of about 64% to about 72%. The transmittance of the reflection adjustment layer may be adjusted according to the content of the pigment and/or dye included in the reflection adjustment layer.

The reflection adjustment layer may absorb light having a wavelength deviated from a specific wavelength range among light emitted from the functional layer EL of each of the light emitting elements ED-1, ED-2, and ED-3. Accordingly, the reflection adjustment layer may prevent or minimize a decrease in brightness of the display panel and/or display device. In addition, at the same time, deterioration in the luminous efficiency of the display panel and/or display device may be prevented or minimized, and the visibility may be improved.

The display device ED according to some embodiments described with reference to FIGS. 1 to 5B includes the second auxiliary pixel defining film IOL and the first auxiliary pixel defining film ML below the pixel defining film PDL, and the first stepped part ST1 having an undercut shape is formed in the first auxiliary pixel defining film ML such that the light emitting elements ED-1, ED-2, and ED-3 are provided in a pixel unit and may be encapsulated in a pixel unit by the encapsulation-inorganic film EN. The encapsulation-inorganic film EN may effectively protect the light emitting elements ED-1, ED-2, and ED-3 from foreign substances, moisture, oxygen, etc. In the display device ED according to some embodiments, the components of the light emitting elements ED-1, ED-2, and ED-3 corresponding to the light emitting regions PXA-R, PXA-G, and PXA-B may be each independently protected, and thus, when the conventional encapsulation member covers the entire light emitting elements as a common layer, a problem of the spread of defects in the encapsulation member may be solved, thereby exhibiting excellent reliability characteristics and improving yield of a display device manufacturing process. Meanwhile, in the display device ED according to some embodiments, unlike the conventional encapsulation layer including the multi-layered structure, the encapsulation-inorganic film EN seals the light emitting element in the single-layered structure, and thus the step coverage of the encapsulation-inorganic film EN is excellent, and the first stepped part ST1 having an undercut shape is included to increase the adhesion of the encapsulation-inorganic film EN, thereby effectively protecting the light emitting elements ED-1, ED-2, and ED-3. In addition, the edges of the second electrodes CE of the light emitting elements ED-1, ED-2, and ED-3 may be in contact with the first auxiliary pixel defining film ML including a metal material to be electrically connected to each other, and may exhibit an effect of providing the second electrode CE as a common layer throughout the light emitting regions PXA-R, PXA-G, and PXA-B.

Hereinafter, a display device according to some embodiments will be described in more detail with reference to FIGS. 6 to 9. In describing the display device according to some embodiments illustrated in FIGS. 6 to 9, the duplicated features which have been described with reference to FIGS. 1 to 5B may not be described again, and their differences will be mainly described.

Figure 6:
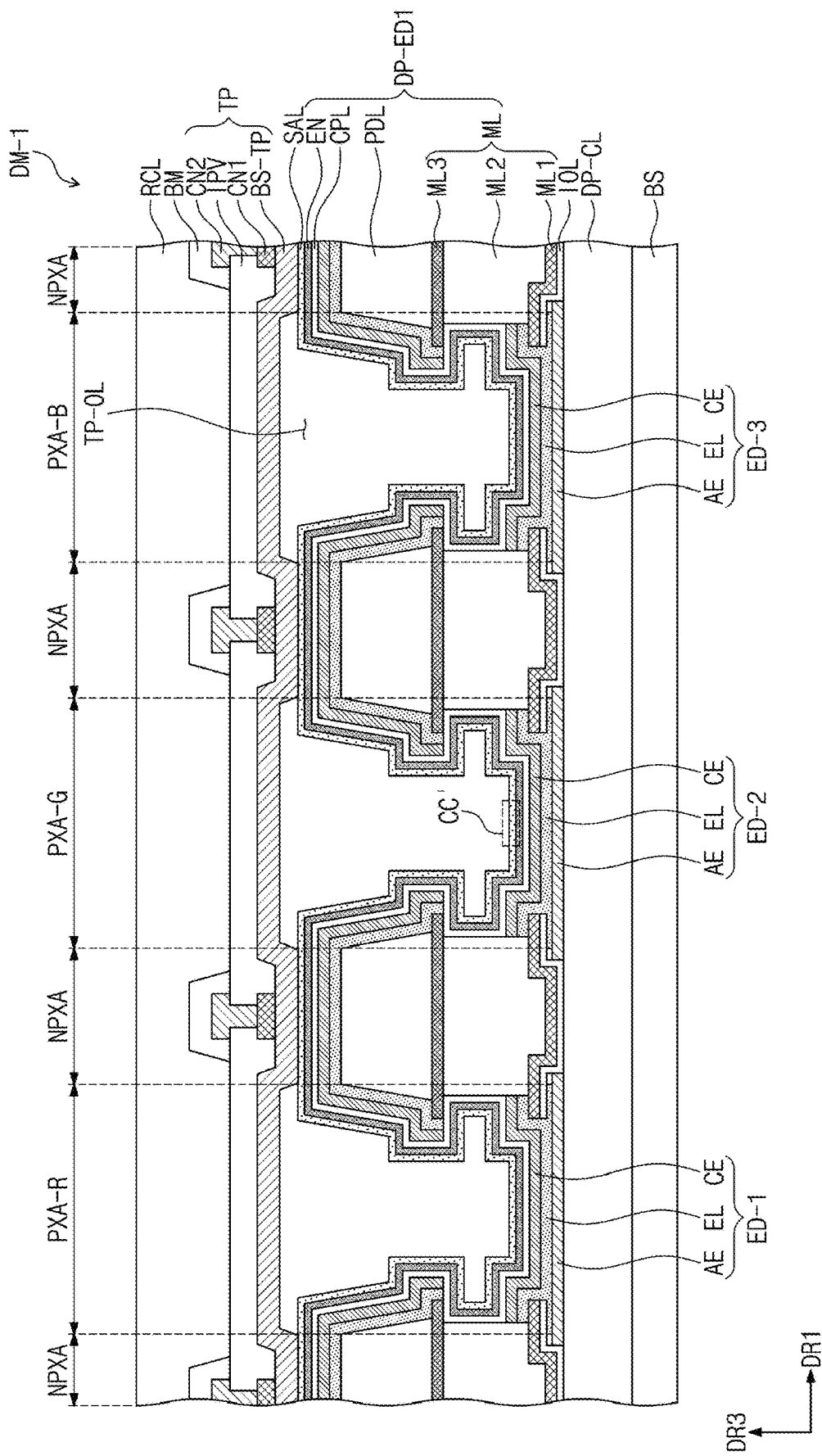
FIG. 6 is a cross-sectional view of a display module according to some embodiments of the inventive concept.

FIG. 6 is a cross-sectional view illustrating aspects of some embodiments of a display module included in the display device according to some embodiments. FIG. 6 may be a cross-sectional view taken along the line II-II' of FIG. 2.

Referring to FIG. 6, the display module DM-1 according to some embodiments may further include an auxiliary layer SAL as compared with the display module DM illustrated in FIG. 4A, etc. The display module DM-1 according to some embodiments may include a base layer BS, a circuit layer DP-CL, a display element layer DP-ED1, a filling layer TP-OL, and a sensor layer TP. In addition, the display module DM-1 according to some embodiments may further include an optical layer RCL.

In the display module DM-1 according to some embodiments, the display element layer DP-ED1 may include light emitting elements ED-1, ED-2, and ED-3, a second auxiliary pixel defining film IOL, a first auxiliary pixel defining film ML, a pixel defining film PDL, a sacrificial layer SL, an encapsulation-inorganic film EN, and the auxiliary layer SAL. The display module DM-1 according to some embodiments may further include a capping layer CPL. The capping layer CPL, the encapsulation-inorganic film EN, and the auxiliary layer SAL may be sequentially stacked, and the stacked structure of the capping layer CPL, the encapsulation-inorganic film EN, and the auxiliary layer SAL may serve as a barrier layer that effectively protects the lower light emitting elements ED-1, ED-2, and ED-3.

According to some embodiments as illustrated in FIG. 6, the filling layer TP-OL may be located on the auxiliary layer SAL. The filling layer TP-OL may be directly located on the auxiliary layer SAL. The filling layer TP-OL may be patterned to cover the auxiliary layer SAL, to overlap the light emitting regions PXA-R, PXA-G, and PXA-B, and not to overlap a part of the non-light emitting regions NPXA.

Figure 7:
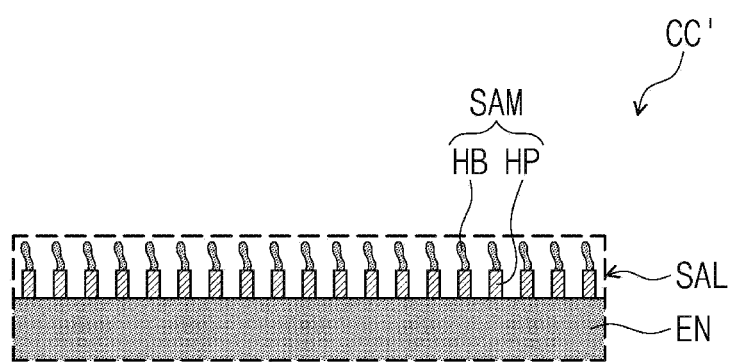
FIG. 7 is a cross-sectional view illustrating a part of a display module according to some embodiments of the inventive concept.

FIG. 7 is a cross-sectional view illustrating a part of the display module according to some embodiments. FIG. 7 may be a cross-sectional view illustrating CC' region of FIG. 6.

Referring to FIGS. 6 and 7, according to some embodiments, the auxiliary layer SAL is a self-assembled monolayer, and may serve to protect the lower light emitting elements ED-1, ED-2, and ED-3, and prevent permeation of moisture during a cleaning process after the auxiliary layer SAL is provided.

The contact angle of water on the top surface of the auxiliary layer SAL may be about 90° or more. For example, the contact angle of water on the top surface of the auxiliary layer SAL may be about 100° or more.

According to some embodiments, the auxiliary layer SAL may include an organic molecule SAM containing a hydrophilic portion HP and a hydrophobic portion HB. According to some embodiments, the auxiliary layer SAL may be a self-assembled monolayer formed of the organic molecule SAM.

According to some embodiments, the auxiliary layer SAL may include the organic molecule SAM including a silane-based moiety in the hydrophilic portion HP and a fluoro-based moiety in the hydrophobic portion HB. For example, the auxiliary layer SAL may include at least one of tridecafluoro-1,2,2-tetrahydrooctyl trichlorosilane (FOTS), perfluorodecyltrichlorosilane (FDTS), i-butyltrichlorosilane (IBTCS), decyltrichlorosilane (DTCS), octadecyl trichlorosilane (OTS), octyltrichlorosilane (OTCS), n-dodecyltrichlorosilane (DDTCS), trichloro(n-dodecyl)silane (FNTS), trichloro(3,3,3-trifluoropropyl)silane (FPTS), or methoxy polyethylene glycol silane (mPEGS). Specifically, the auxiliary layer SAL may include FOTS or FDTS.

The hydrophilic portion HP of the organic molecule SAM included in the auxiliary layer SAL may be arranged to be adjacent to the encapsulation-inorganic film EN, and the hydrophobic portion HB may be arranged to be spaced apart from the encapsulation-inorganic film EN. The hydrophilic portion HP of the organic molecule SAM may increase adhesion in the encapsulation-inorganic film EN, and thus the stacked structure of the encapsulation-inorganic film EN and the auxiliary layer SAL may function as an effective barrier. In addition, the hydrophobic portion HB of the organic molecule SAM may exhibit relatively liquid repellent properties, thereby preventing water provided during a cleaning process or the like from penetrating into the lower light emitting elements. That is, the display module DM-1 of the inventive concept may further include the auxiliary layer SAL to sufficiently delay, in the auxiliary layer SAL, the penetration of moisture provided during a cleaning process or the like among subsequent manufacturing processes of the display module, thereby improving process stability during the manufacturing of the display module and improving reliability of the display device.

Figure 8:
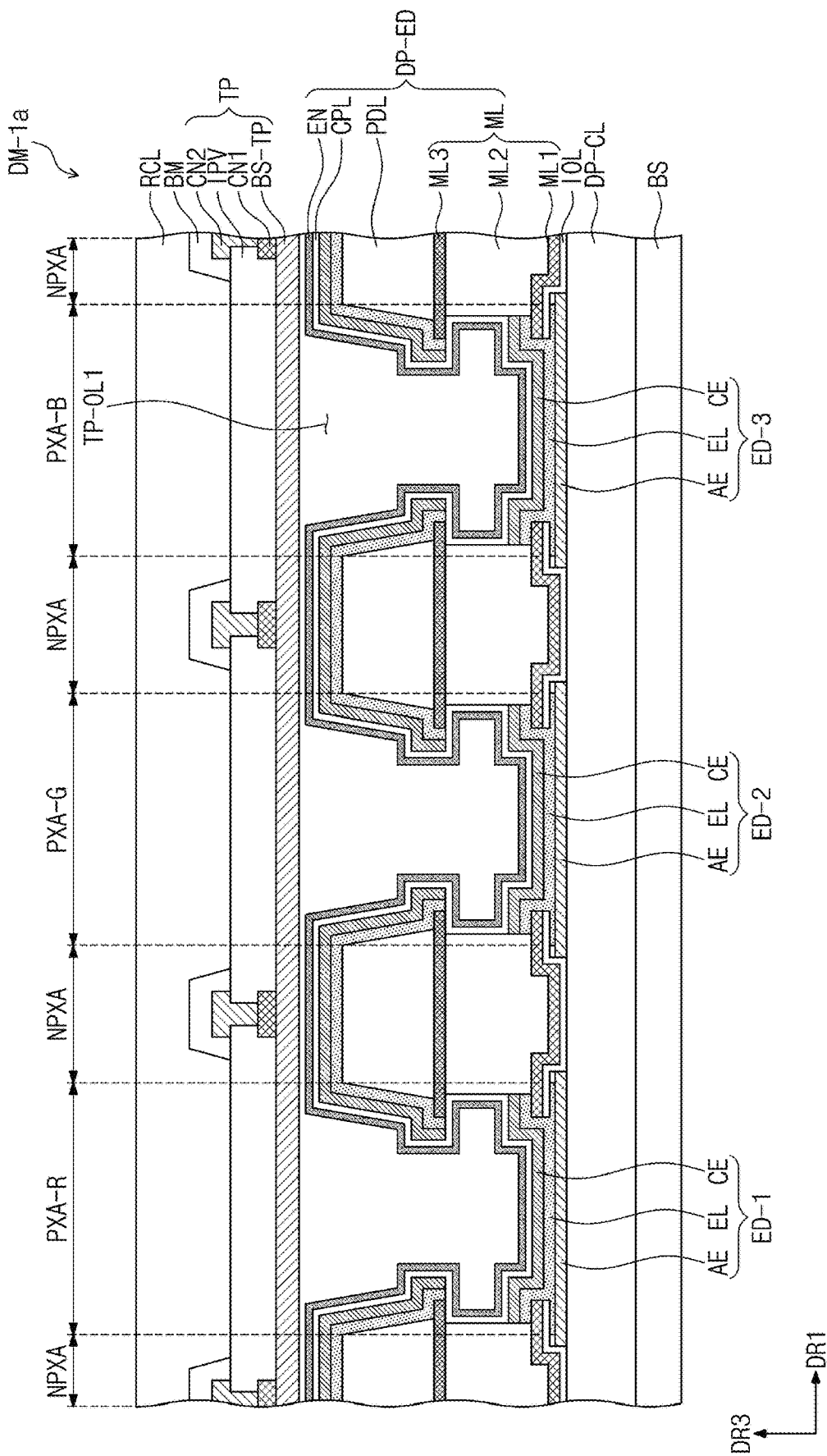
FIG. 8 is a cross-sectional view of a display module according to some embodiments of the inventive concept.

FIG. 8 is a cross-sectional view of a display module DM-1a according to some embodiments. In the display module DM-1a of embodiments illustrated with respect to FIG. 8, a filling layer TP-OL1 may be provided as a common layer that covers the whole of the light emitting regions PXA-R, PXA-G, and PXA-B and non-light emitting regions NPXA, as compared with the display module DM illustrated in FIG. 4A or the like.

The display module DM-1a according to some embodiments may include a base layer BS, a circuit layer DP-CL, a display element layer DP-ED, a filling layer TP-OL1, and a sensor layer TP. In addition, the display module DM-1a according to some embodiments may further include an optical layer RCL.

In the display module DM-1a according to some embodiments, the display element layer DP-ED may include light emitting elements ED-1, ED-2, and ED-3, a second auxiliary pixel defining film IOL, a first auxiliary pixel defining film ML, a pixel defining film PDL, a sacrificial layer SL, and an encapsulation-inorganic film EN. The display module DM-1a according to some embodiments may further include a capping layer CPL. The capping layer CPL, the encapsulation-inorganic film EN, and the auxiliary layer SAL may be sequentially stacked, and the stacked structure of the capping layer CPL, the encapsulation-inorganic film EN, and the auxiliary layer SAL may serve as a barrier layer that effectively protects the lower light emitting elements ED-1, ED-2, and ED-3.

As illustrated in FIG. 8, the filling layer TP-OL1 may be provided to cover the encapsulation-inorganic film EN and to overlap the whole of the light emitting regions PXA-R, PXA-G, and PXA-B and non-light emitting regions NPXA.

Figure 9:
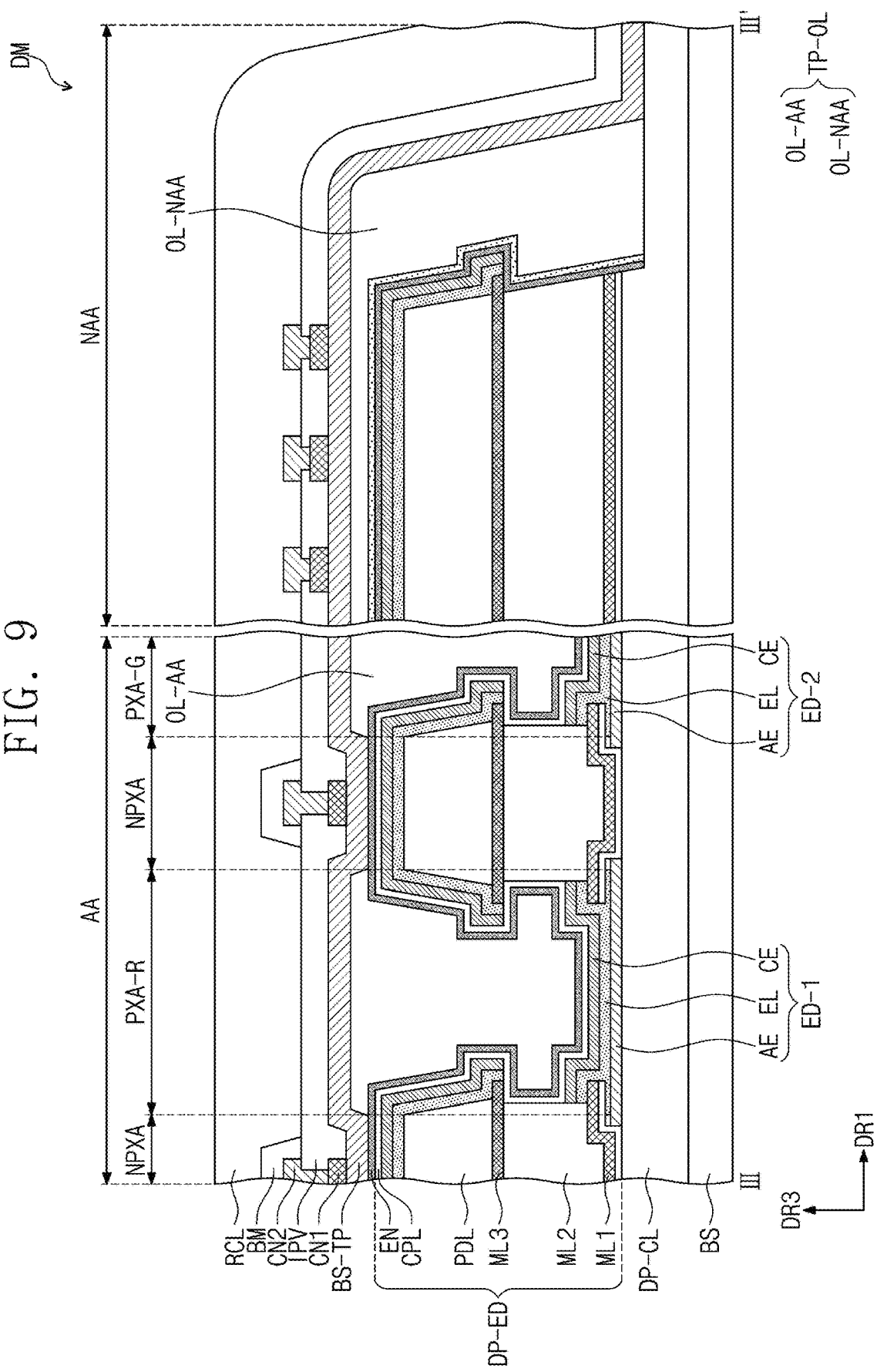
FIG. 9 is a cross-sectional view of a display module according to some embodiments of the inventive concept.

FIG. 9 is a cross-sectional view of a display module according to some embodiments. FIG. 9 may illustrate a part taken along the line III-III' of FIG. 2. Meanwhile, FIG. 9 illustrates the active region AA of the display module DM illustrated in FIG. 4B and the peripheral region NAA of the display module DM although the peripheral region NAA is not illustrated in FIG. 4B.

Referring to FIG. 9, in the display module DM according to some embodiments, the filling layer TP-OL may include a first filling part OL-AA located in the active region AA and a second filling part OL-NAA located in the peripheral region NAA. In the active region AA, the first filling part OL-AA may be patterned to overlap the whole of the light emitting regions PXA-R and PXA-G and not to overlap part of the non-light emitting regions NPXA. In addition, the second filling part OL-NAA located in the peripheral region NAA may cover the whole of the display element layer DP-ED without being patterned. Even when the first filling part OL-AA is patterned and provided in the active region AA, the second filling part OL-NAA may be provided as a single layer without being patterned in the peripheral region NAA to sufficiently cover the edge part of the display element layer DP-ED. In addition, as illustrated in FIG. 8 or the like, even when the filling layer TP-OL is not patterned in the active region AA and overlaps the whole of the light emitting regions PXA-R and PXA-G and non-light emitting regions NPXA, the second filling part OL-NAA may be provided as a single layer without being patterned.

Meanwhile, according to some embodiments, in the display module DM-1 illustrated with respect to FIG. 6, the filling layer TP-OL may be provided as a single layer to sufficiently cover the edge part of the display panel DP in the peripheral region NAA.

The display device in embodiments including the display module according to some embodiments as illustrated with respect to FIGS. 4A to 9 as described above may include a first auxiliary pixel defining film in which a first stepped part having an undercut shape is defined and a second auxiliary pixel defining film in which a second stepped part having an undercut shape is defined between a pixel defining film and a circuit layer, and may effectively cover components of the light emitting elements located below the undercut of the first stepped part with a stacked structure including at least one of a capping layer, an inorganic film, or an auxiliary layer. Accordingly, even when a defect is caused in a part of the light emitting regions, the defective part is not spread to the neighboring light emitting region, and the light emitting element located in the undercut part is protected by the inorganic film or the like, and thus the display device may exhibit relatively improved reliability characteristics.

Hereinafter, a method for manufacturing a display device according to some embodiments will be described with reference to FIGS. 10 to 11I. In the description of a method for manufacturing a display device according to some embodiments as described with reference to FIGS. 10 to 11I, the duplicated contents with the description of the display device according to some embodiments as described in FIGS. 1 to 9 may not be described again, and the differences will be mainly described.

Figure 10:
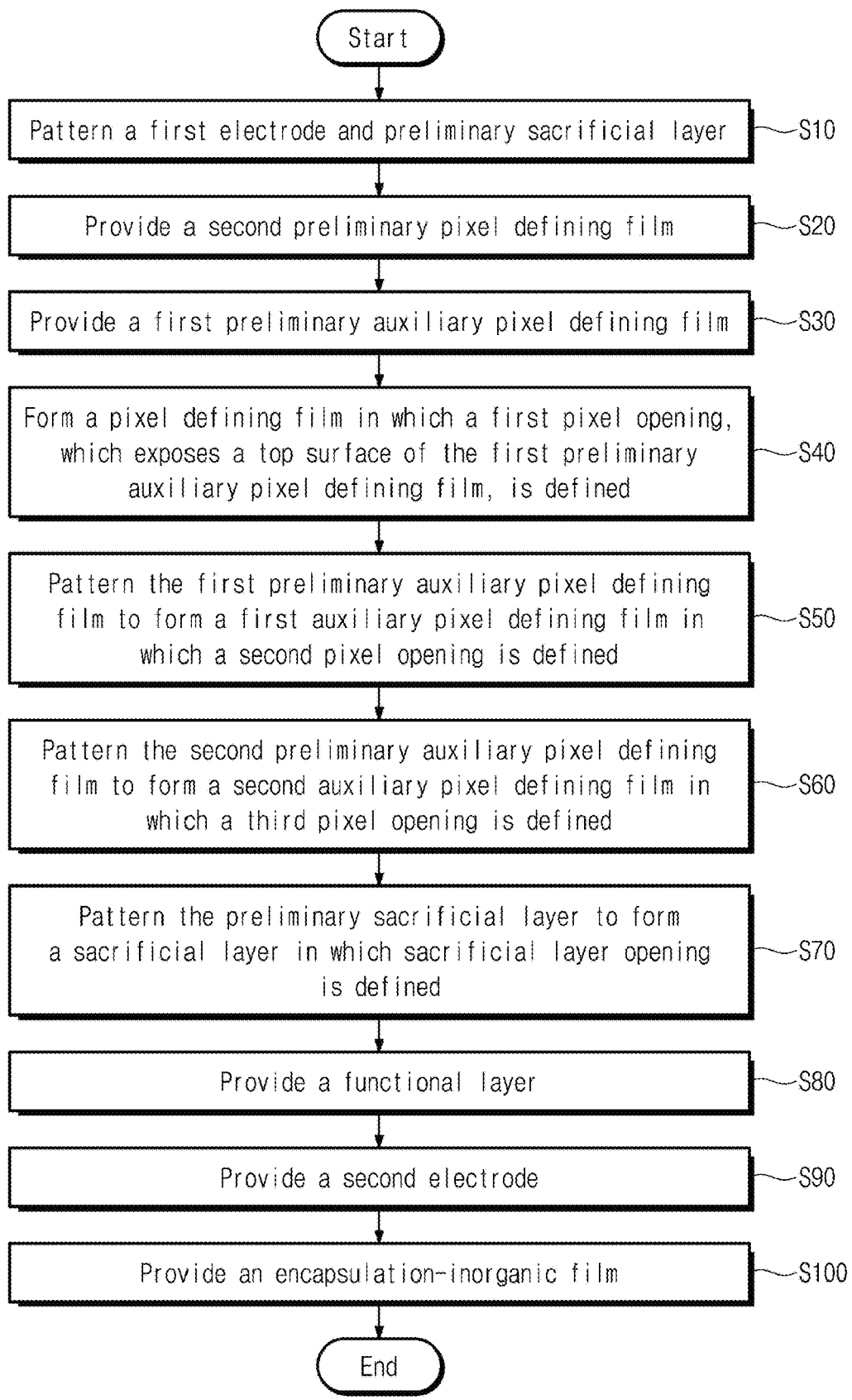
FIG. 10 is a flowchart illustrating operations of a method for manufacturing a display device according to some embodiments of the inventive concept.

FIG. 10 is a flowchart illustrating operations of a method for manufacturing a display device according to some embodiments. FIGS. 11A through 11I are each views schematically illustrating a part of operations of a method for manufacturing a display device according to some embodiments. The operations of the method for manufacturing a display device according to embodiments illustrated with respect to FIGS. 11A to 11I may be operations that sequentially proceed.

The method for manufacturing a display device according to some embodiments may include patterning a first electrode and a preliminary sacrificial layer (S10), providing a second preliminary auxiliary pixel defining film (S20), providing a first preliminary auxiliary pixel defining film (S30), forming a pixel defining film in which a first pixel opening, which exposes the top surface of the first preliminary auxiliary pixel defining film, is defined (S40), patterning the first preliminary auxiliary pixel defining film to form a first auxiliary pixel defining film in which a second pixel opening is defined (S50), patterning the second preliminary auxiliary pixel defining film to form a second auxiliary pixel defining film in which a third pixel opening is defined (S60), patterning the preliminary sacrificial layer to form a sacrificial layer in which a sacrificial layer opening is defined (S70), providing a functional layer (S80), providing a second electrode (S90), and providing an encapsulation-inorganic film (S100).

Figure 11A:
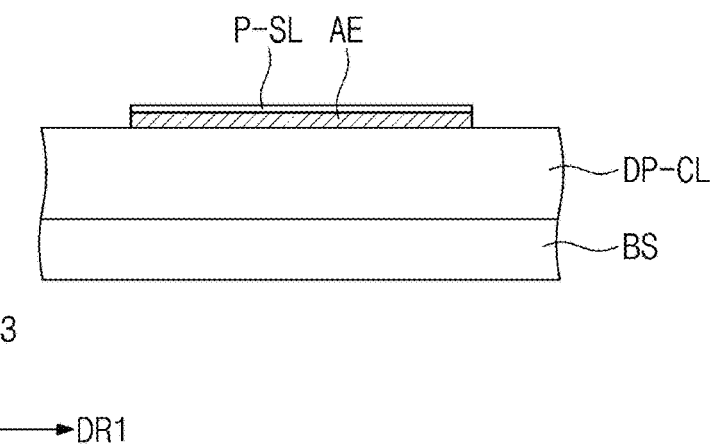
FIGS. 11A through 11I are views illustrating a part of operations of a method for manufacturing a display device according to some embodiments of the inventive concept.

FIG. 11A is a view illustrating an example operation (S10) of patterning a first electrode and a preliminary sacrificial layer. Referring to FIG. 11A, a circuit layer DP-CL may be located on a base layer BS, and the patterned first electrode AE and the patterned preliminary sacrificial layer P-SL may be located on the circuit layer DP-CL. For example, the preliminary sacrificial layer P-SL may include at least one of IZO or IGZO. For example, the first electrode AE and the preliminary sacrificial layer P-SL may be patterned in the same process. However, the embodiments of the inventive concept are not limited thereto, and after the first electrode AE is patterned, the preliminary sacrificial layer P-SL may be patterned to correspond to the shape of the first electrode AE.

Figure 11B:
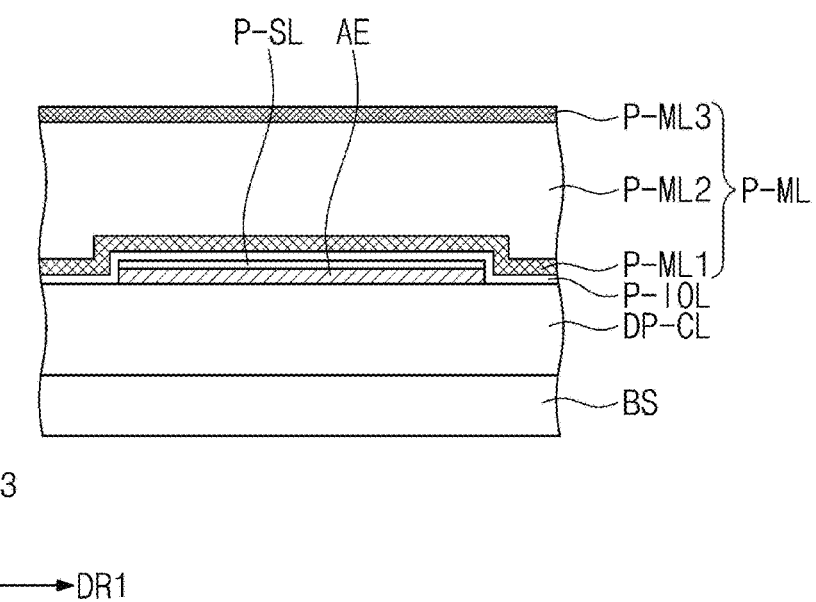

FIG. 11B is a view illustrating an example operation (S20) of providing a second preliminary auxiliary pixel defining film P-IOL and an operation (S30) of providing a first preliminary auxiliary pixel defining film P-ML. Referring to FIG. 11B, the second preliminary auxiliary pixel defining film P-IOL may be located on the preliminary sacrificial layer P-SL. The second preliminary auxiliary pixel defining film P-IOL may be provided to overlap the circuit layer DP-CL throughout, and to cover the patterned first electrode AE and the preliminary sacrificial layer P-SL. In addition, the first preliminary auxiliary pixel defining film P-ML may be provided to overlap the second preliminary auxiliary pixel defining film P-IOL throughout.

The first preliminary auxiliary pixel defining film P-ML may be formed by providing a metal material. For example, the first preliminary auxiliary pixel defining film P-ML may include molybdenum, silver, titanium, copper, aluminum, or an alloy thereof. The first preliminary auxiliary pixel defining film P-ML may have a single layered structure or a multi-layered structure, for example a three-layered structure. According to some embodiments, the first preliminary auxiliary pixel defining film P-ML may include three metal layers. The first preliminary auxiliary pixel defining film P-ML may include a first preliminary metal layer P-ML1 located on the second preliminary auxiliary pixel defining film P-IOL, a second preliminary metal layer P-ML2 located on the first preliminary metal layer P-ML1, and a third preliminary metal layer P-ML3 located on the second preliminary metal layer P-ML2. The first preliminary metal layer P-ML1, the second preliminary metal layer P-ML2, and the third preliminary metal layer P-ML3 may include the same material, or at least one may include a different material from the others. For example, each of the first preliminary metal layer P-ML1 and the third preliminary metal layer P-ML3 may include titanium, and the second preliminary metal layer P-ML2 may include aluminum. However, the embodiments of the inventive concept are not limited thereto.

The second preliminary auxiliary pixel defining film P-IOL may include an inorganic material. For example, the second preliminary auxiliary pixel defining film P-IOL may include silicon nitride, silicon oxide, silicon oxynitride, or the like. The second preliminary auxiliary pixel defining film P-IOL may be formed of silicon oxynitride.

Figure 11C:
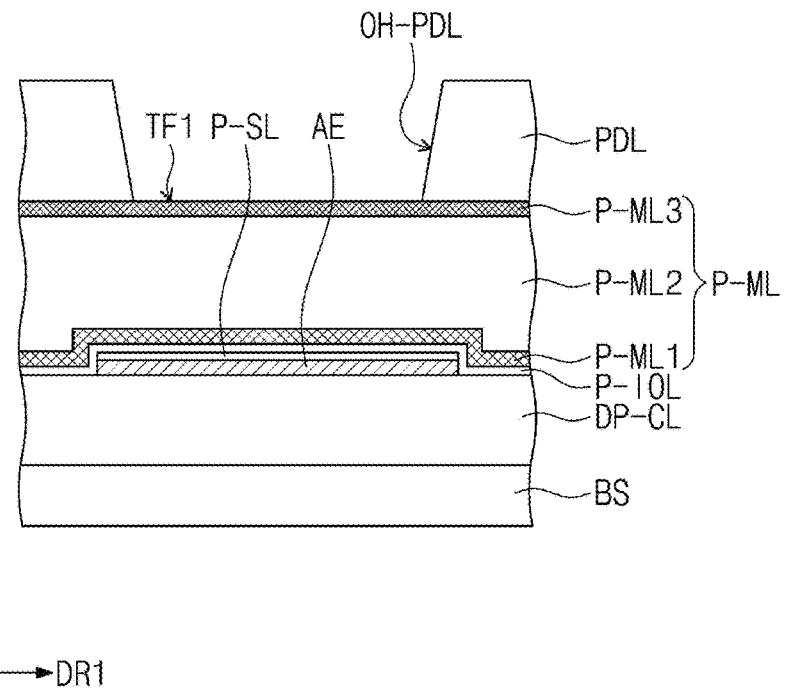

FIG. 11C is a view illustrating an example operation (S40) of forming a pixel defining film PDL in which a first pixel opening OH-PDL, which exposes the top surface TF1 of the first preliminary auxiliary pixel defining film P-ML, is defined.

The pixel defining film PDL may be provided on the first preliminary auxiliary pixel defining film P-ML. The pixel defining film PDL may be directly located on the top surface TF1 of the third preliminary metal layer P-ML3 included in the first preliminary auxiliary pixel defining film P-ML. The first pixel opening OH-PDL may be defined in the pixel defining film PDL. The first pixel opening OH-PDL may expose a part of the top surface TF1 of the third preliminary metal layer P-ML3 that is the top surface of the first preliminary auxiliary pixel defining film P-ML.

Figure 11D:
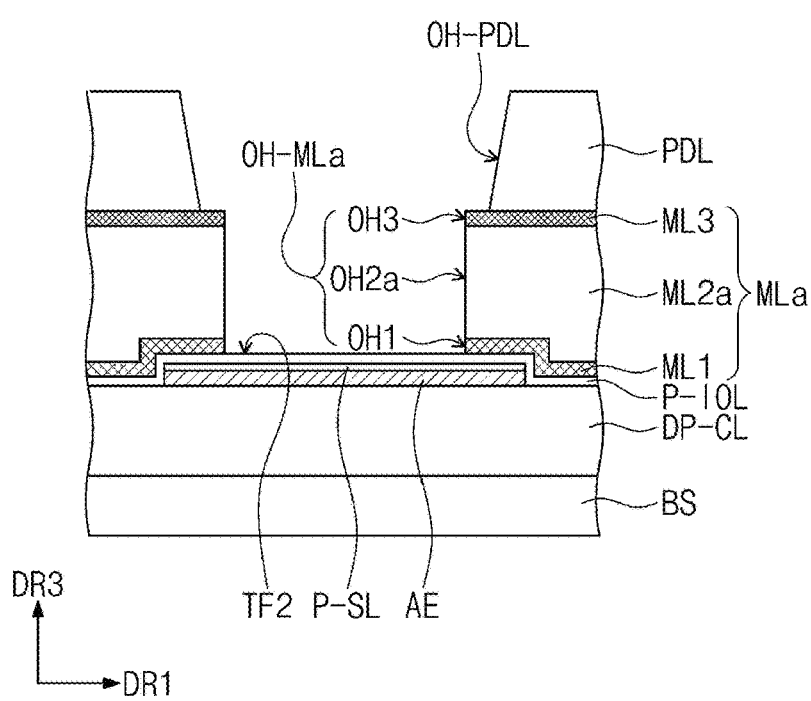

FIG. 11D is a view illustrating an example operation (S50) of patterning the first preliminary auxiliary pixel defining film P-ML to form a first auxiliary pixel defining film PDL in which a second pixel opening is defined. The first preliminary auxiliary pixel defining film P-ML (see FIG. 11C) may be etched using the pixel defining film PDL as a mask to form the first auxiliary pixel defining film MLa in which the second pixel opening OH-MLa is defined. The second pixel opening OH-MLa may expose the top surface TF2 of the second preliminary auxiliary pixel defining film P-IOL.

The first preliminary auxiliary pixel defining film P-ML may be etched by a dry etching method.

The forming of the first auxiliary pixel defining film (S50) includes patterning each of the first preliminary metal layer P-ML1, the second preliminary metal layer P-ML2, and the third preliminary metal layer P-ML3. Specifically, the forming of the first auxiliary pixel defining film (S50) includes patterning the first preliminary metal layer P-ML1, the second preliminary metal layer P-ML2, and the third preliminary metal layer P-ML3 to form a first metal layer ML1, a second metal layer ML2a, and a third metal layer ML3.

Considering the stacking order of the first preliminary auxiliary pixel defining film P-ML, the third preliminary metal layer P-ML3 may be patterned to form the third metal layer ML3 in which a third opening OH3 is defined, the second preliminary metal layer P-ML2 may be patterned to form the second metal layer ML2a in which a second opening OH2a is defined, and then the first preliminary metal layer P-ML1 may be patterned to form the first metal layer ML1 in which a first opening OH1 is defined.

The second pixel opening OH-MLa may include the first opening OH1, the second opening OH2a, and the third opening OH3. In FIG. 11D, the ends of the first metal layer ML1, the second metal layer ML2a, and the third metal layer ML3 may be aligned to each other.

Figure 11E:
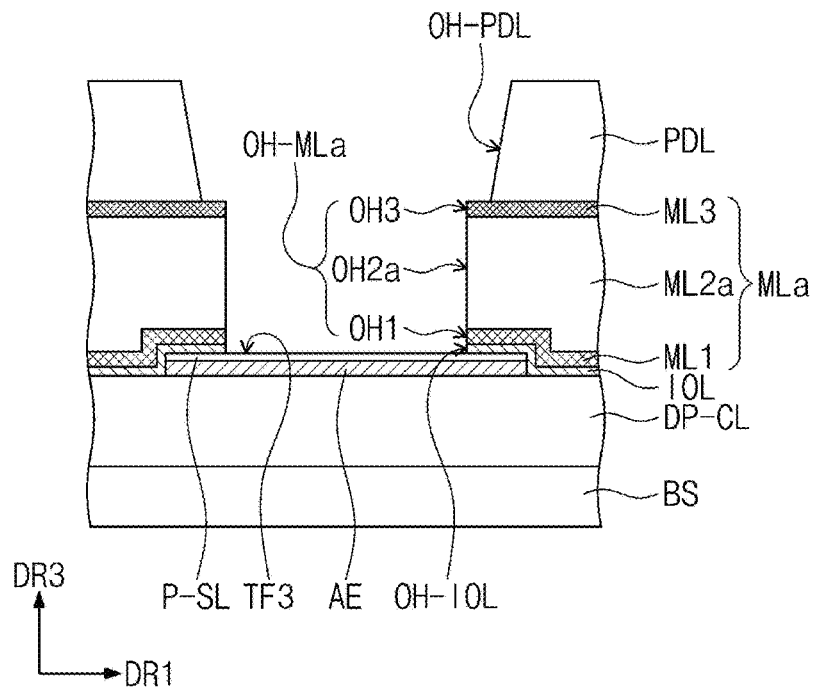

FIG. 11E is a view illustrating an example operation (S60) of patterning the second preliminary auxiliary pixel defining film P-IOL to form a second auxiliary pixel defining film IOL in which a third pixel opening OH-IOL is defined. Referring to FIG. 11E, the second preliminary auxiliary pixel defining film P-IOL may be patterned using the pixel defining film PDL to form the second auxiliary pixel defining film IOL in which the third pixel opening OH-IOL is defined. The second preliminary auxiliary pixel defining film P-IOL may be etched by a dry etching method.

The third pixel opening OH-IOL may expose a part of the top surface TF3 of the preliminary sacrificial layer P-SL. In this case, the preliminary sacrificial layer P-SL may serve as an etching stopper. The second preliminary auxiliary pixel defining film P-IOL may be etched until the top surface TF3 of the preliminary sacrificial layer P-SL is exposed. The preliminary sacrificial layer P-SL may prevent the top surface of the first electrode AE from being damaged during the process of forming the second auxiliary pixel defining film IOL.

Figure 11F:
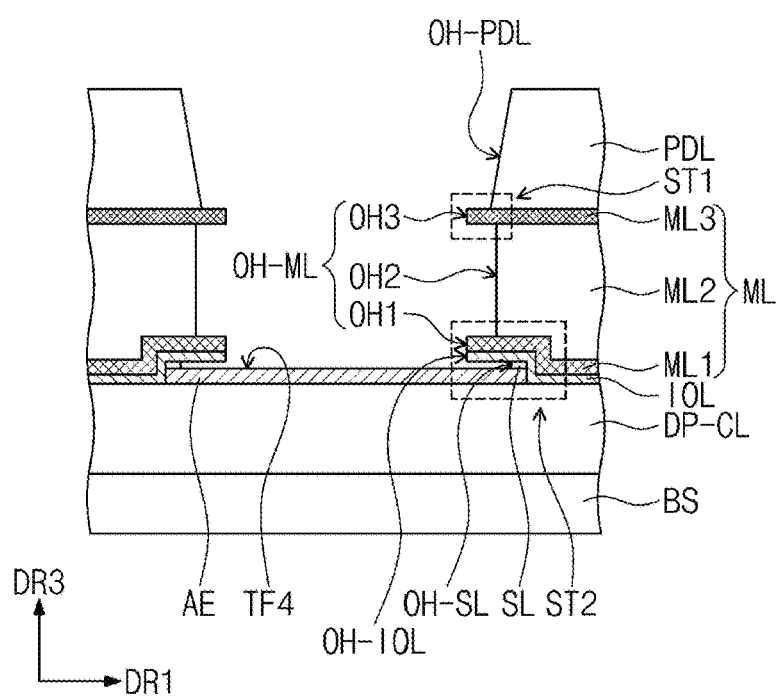

FIG. 11F illustrates an example operation (S70) of patterning the preliminary sacrificial layer P-SL to form a sacrificial layer SL in which a sacrificial layer opening OH-SL is defined. Referring to FIG. 11F, the preliminary sacrificial layer P-SL (see FIG. 11E) may be patterned to form the sacrificial layer SL in which the sacrificial layer opening OH-SL is defined. The sacrificial layer opening OH-SL may expose the top surface TF4 of the first electrode AE1.

The preliminary sacrificial layer P-SL (see FIG. 11E) may be etched by a wet etching method. Meanwhile, as the preliminary sacrificial layer P-SL (see FIG. 11E) is etched, the side surface of the second metal layer ML2a (see FIG. 11E) defining the second opening OH2a (see FIG. 11E) may also be etched. Therefore, in the forming of the sacrificial layer (S70), on a cross-section perpendicular to the first electrode AE, the width of the second opening OH2 defined in the second metal layer ML2 may become larger than the width of the first opening OH1 defined in the first metal layer ML1 and the width of the third opening OH3 defined in the third metal layer ML3. As the side surface of the third metal layer ML3 protrudes from the side surface of the second metal layer ML2, a first stepped part ST1 having an undercut shape may be formed. In addition, due to a difference in position between the edge of the second metal layer ML2 and the edge of the first metal layer ML1, one end of the first metal layer ML1 may protrude from the side surface of the second metal layer ML2, thereby having a tip shape.

In addition, on a cross-section perpendicular to the first electrode AE, as the width of the sacrificial layer opening OH-SL is formed to be larger than the width of the third pixel opening OH-IOL, the second stepped part ST2 having an undercut shape may be formed due to a difference in position between the edge of the sacrificial layer SL and the edge of the second auxiliary pixel defining film IOL.

The inventive concept may include the second auxiliary pixel defining film IOL between the first metal layer ML1 and the sacrificial layer SL, thereby preventing one end of the tip shape of the first metal layer ML1 from sagging. The method for manufacturing a display device according to some embodiments may include the second auxiliary pixel defining film IOL including an inorganic material below the first auxiliary pixel defining film ML, thereby preventing the first auxiliary pixel defining film ML from sagging and preventing the first auxiliary pixel defining film ML from being in contact with the first electrode AE.

Figure 11G:
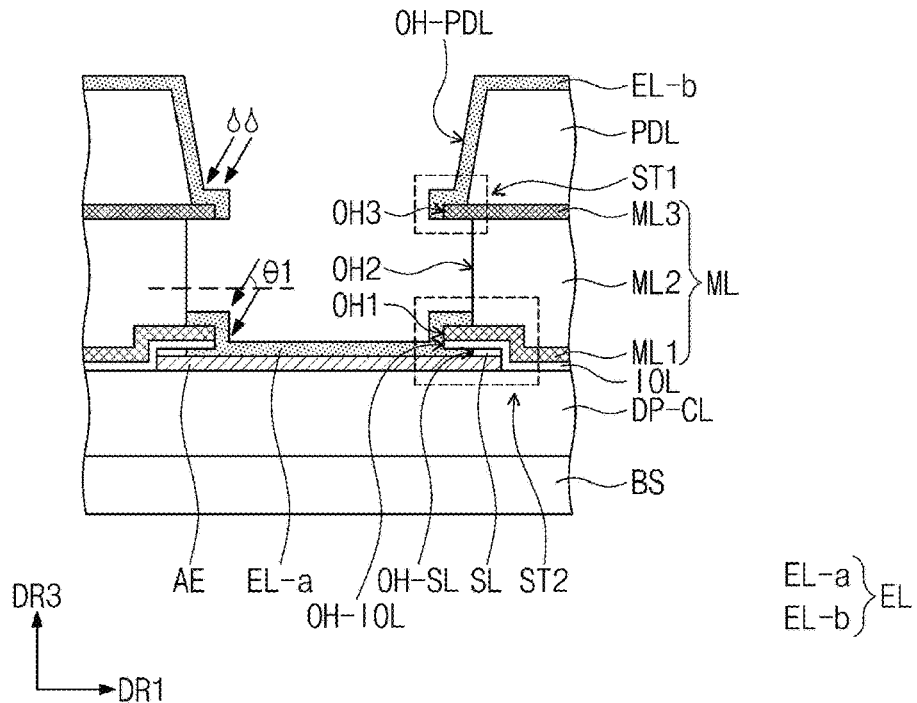

FIG. 11G is a view illustrating an example operation (S80) of providing a functional layer EL. Referring to FIG. 11G, the functional layer EL may be provided on the top surface TF4 (see FIG. 11F) of the first electrode AE exposed by the sacrificial layer openings OH-SL.

The functional layer EL provided in the providing of the functional layer (S80) may include a first sub-functional layer EL-a and a second sub-functional layer EL-b. The first sub-functional layer EL-a may be short-circuited with the second sub-functional layer EL-b. There may be a part in which the functional layer EL is not located on the side surface of the second metal layer ML2.

The first sub-functional layer EL-a may be located on the first electrode AE under the first stepped part ST1, and may be arranged such that it is in contact with the first electrode AE, the sacrificial layer SL, the second auxiliary pixel defining film IOL, and the second metal layer ML2. The second sub-functional layer EL-b may be spaced apart from the first sub-functional layer EL-a, and may be arranged such that it is in contact with the exposed side surface and the top surface of the third metal layer ML3 and the side surface and the top surface of the pixel defining film PDL. Meanwhile, the first sub-functional layer EL-a may include a hole transport region, an emission layer, and an electron transport region, and the second sub-functional layer EL-b may include a hole transport region and an electron transport region. The second sub-functional layer EL-b may not include an emission layer, or may include an emission layer only in a part adjacent to the first sub-functional layer EL-a.

Meanwhile, the providing of the functional layer (S80) includes depositing a functional layer EL forming material at a first angle 81 on the side surface of the second metal layer ML2. The first angle 81 is an angle measured with respect to a surface parallel to the first electrode AE.

Figure 11H:
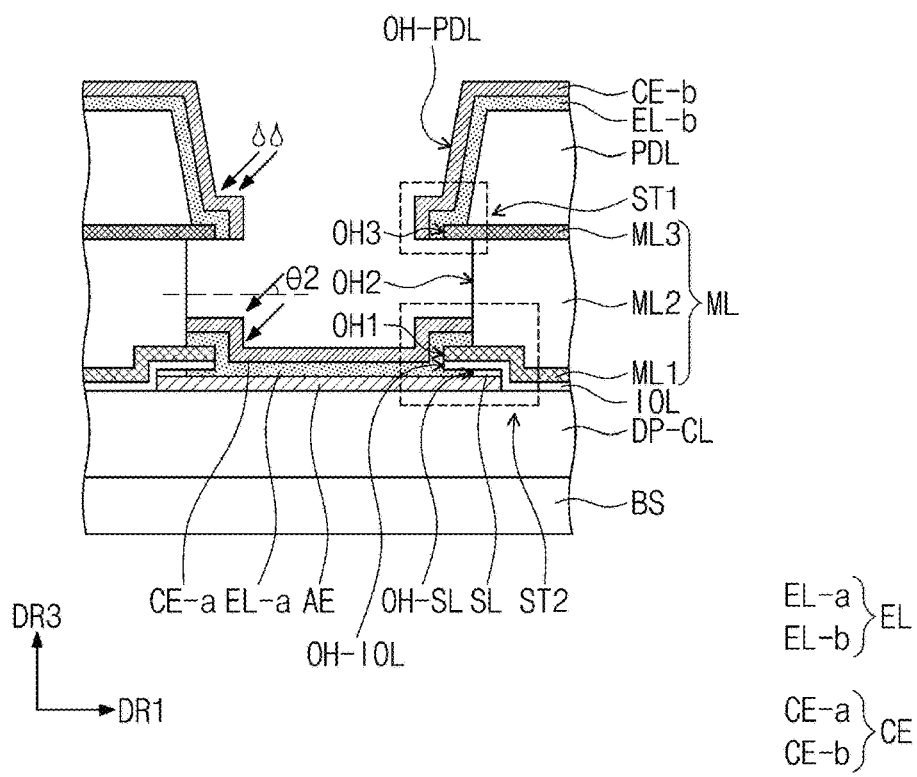

FIG. 11H is a view illustrating an example operation (S90) of providing a second electrode. Referring to FIG. 11H, the second electrode CE provided in the providing of the second electrode (S90) may include a first sub-electrode CE-a and a second sub-electrode CE-b. The first sub-electrode CE-a may be located on the first sub-functional layer EL-a, and the second sub-electrode CE-b may be located on the second sub-functional layer EL-b.

In the providing of the second electrode CE (S90), the second electrode CE may be in contact with the functional layer EL and the first auxiliary pixel defining film ML. The second electrode CE may be in contact with the second metal layer ML2 of the first auxiliary pixel defining film ML.

The first sub-electrode CE-a may be short-circuited with the second sub-electrode CE-b. There may be a part in which the second electrode CE is not located on the side surface of the second metal layer ML2.

Meanwhile, the providing of the second electrode CE (S90) includes depositing the second electrode CE forming material on the side surface of the second metal layer ML2 at a second angle 82. The second angle 82 is an angle measured with respect to a surface parallel to the first electrode AE. The second angle 82 may be smaller than the first angle 81, and for example, a difference between the first angle 81 and the second angle 82 may be about 10°.

As the second angle 82 is set to be smaller than the first angle 81, the first sub-electrode CE-a may be deposited higher than one end of the first sub-functional layer EL-a on the side surface of the second metal layer ML2, and one end of the first sub-electrode CE-a may be in contact with the side surface of the second metal layer ML2. The first sub-electrode CE-a may be electrically connected to the second metal layer ML2.

The second electrode CE is short-circuited due to the first sub-electrode CE-a and the second sub-electrode CE-b, but the first sub-electrodes CE-a located in each of the light emitting regions PXA-R and PXA-G may be electrically connected to each other through the second metal layer ML2. Accordingly, the display module of the inventive concept may have an effect of providing the second electrode CE as a common layer in the light emitting regions PXA-R and PXA-G.

Figure 11I:
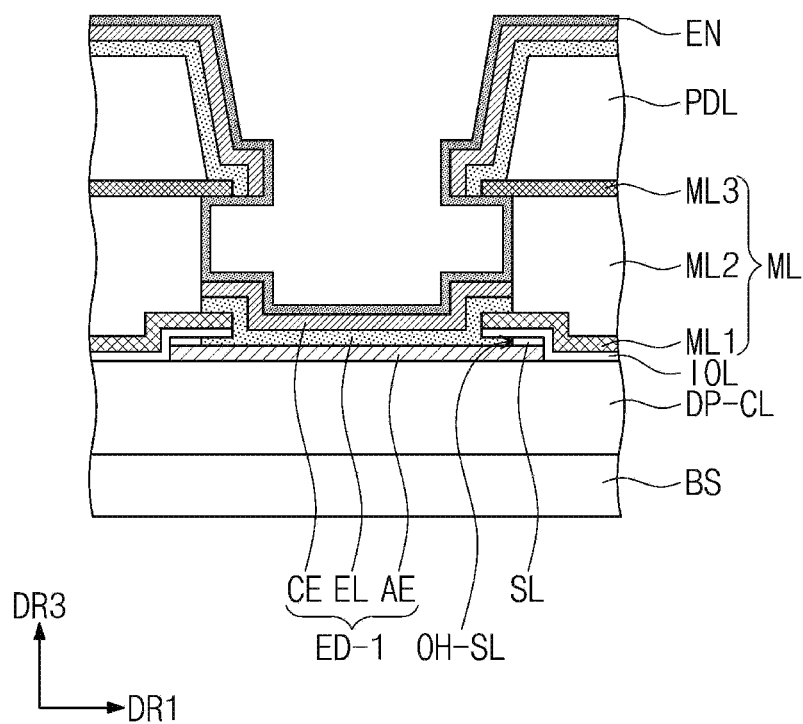

FIG. 11I illustrates an example operation (S100) of providing an encapsulation-inorganic film EN.

The encapsulation-inorganic film EN may be formed or arranged to cover the second electrode CE and the first auxiliary pixel defining film ML that is exposed because the second electrode CE including the first sub-electrode CE-a (see FIG. 11H) and the second sub-electrode CE-b (see FIG. 11H) may not be located at that location. The encapsulation-inorganic film EN may be provided to overlap the whole of the light emitting elements and the pixel defining film PDL.

The providing of the encapsulation-inorganic film EN (S100) may include depositing an encapsulation-inorganic material by any one of a chemical vapor deposition method or an atomic layer deposition method.

For example, the providing of the encapsulation-inorganic film EN (S100) may include forming an inorganic film including silicon nitride using any one of the chemical vapor deposition method or the atomic layer deposition method.

Meanwhile, according to some embodiments, the method for manufacturing a display device according to some embodiments may further include forming other constituent layers, such as the filling layer TP-OL (see FIG. 4A) and the sensor layer TP (see FIG. 4A), after the manufacturing processes described with reference to FIGS. 11A to 11I.

For example, the method for manufacturing the display device including the display module DM according to the embodiments illustrated with respect to FIG. 4A may further include surface-treating the top surface of the encapsulation-inorganic film EN into hydrophobicity, forming the filling layer TP-OL on the encapsulation-inorganic film EN, and forming the sensor layer TP on the filling layer TP-OL after the forming of the encapsulation-inorganic film EN (S100). The sensor layer TP may include a sensing base layer BS-TP, a first conductive layer CN1, a sensing insulation layer IPV, and a second conductive layer CN2 sequentially stacked.

The surface-treating of the top surface of the encapsulation-inorganic film EN into hydrophobicity may include any one of surface-treating the top surface of the encapsulation-inorganic film EN with $NH_3$ or fluorine (F) gas, and forming an auxiliary layer, which is a self-assembled monolayer containing a hydrophilic portion and a hydrophobic portion on the encapsulation-inorganic film EN. For example, the method for manufacturing the display device including the display module DM-1 according to some embodiments illustrated in FIGS. 6 and 7 may further include forming the auxiliary layer SAL with the organic molecule SAM containing the hydrophilic portion HP and the hydrophobic portion HB on the encapsulation-inorganic film EN.

Alternatively, the method for manufacturing the display device including the display module DM according to some embodiments as illustrated with respect to FIG. 4A may further include forming the capping layer CPL between the providing of the second electrode CE (S90) and the providing of the encapsulation-inorganic film EN (S100).

The display device according to some embodiments includes the first auxiliary pixel defining film having an undercut shape under the pixel defining film and including a metal material and a second auxiliary pixel defining film including an inorganic material, and the light emitting elements are provided in a pixel unit by the undercut and the light emitting elements are encapsulated in a pixel unit by the inorganic encapsulation film, thereby exhibiting relatively excellent reliability characteristics. That is, the display device according to some embodiments may exhibit relatively improved reliability by arranging the components of the light emitting elements such that the components are short-circuited with the neighboring light emitting element by the undercut shape, and the components of the light emitting elements located in each pixel are encapsulated with an inorganic encapsulation film to thus prevent the defects of the encapsulation member from spreading to the neighboring light emitting regions like the existing case where the encapsulation member is provided on the light emitting element in which the undercut-shaped opening is not introduced.

The method for manufacturing a display device according to some embodiments may include covering light emitting elements with an encapsulation-inorganic film having a single-layered structure to improve step coverage of the encapsulation-inorganic film, and include forming an undercut-shaped step on a first auxiliary pixel defining film to increase peel strength of the encapsulation-inorganic film. Accordingly, each of the light emitting elements arranged to correspond to each light emitting region may be effectively encapsulated by the undercut, and a display device having relatively excellent reliability may be manufactured.

The display device according to some embodiments may have relatively improved reliability.

The method for manufacturing a display device according to some embodiments may provide a display device having relatively excellent reliability.

Although aspects of some embodiments of the inventive concept have been described with reference to some embodiments, it will be understood that the inventive concept should not be limited to these illustrated embodiments, and various changes and modifications can be made by those skilled in the art without departing from the spirit and scope of the inventive concept.

Accordingly, the technical scope of embodiments according to the inventive concept is not intended to be limited to the contents set forth in the detailed description of the specification, but is intended to be defined by the appended claims, and their equivalents.

What is claimed is:

1. A display device comprising:
a base layer;
a circuit layer on the base layer;
a light emitting element including a first electrode on the circuit layer, a functional layer on the first electrode, and a second electrode on the functional layer;
a pixel defining film on the circuit layer and having a first pixel opening;
a first auxiliary pixel defining film which includes a metal substance and is between the pixel defining film and the circuit layer and having a second pixel opening; and
a second auxiliary pixel defining film between the circuit layer and the first auxiliary pixel defining film and having a third pixel opening, which exposes one surface of the first electrode,
wherein the second electrode is in contact with the first auxiliary pixel defining film.

2. The display device of claim 1, wherein the first auxiliary pixel defining film comprises:
a first metal layer having a first opening and which is on the second auxiliary pixel defining film;
a second metal layer having a second opening and which is on the first metal layer; and
a third metal layer having a third opening and which is on the second metal layer.

3. The display device of claim 2, wherein, on a cross section perpendicular to the base layer, a width of the second opening is larger than a width of the first opening and a width of the third opening.

4. The display device of claim 2, wherein each of the first metal layer and the third metal layer comprises titanium (Ti), and the second metal layer comprises aluminum (Al).

5. The display device of claim 2, further comprising a sacrificial layer between the first electrode and the second auxiliary pixel defining film,
wherein the sacrificial layer overlaps the first electrode and the second auxiliary pixel defining film on a plane, and a sacrificial layer opening, which exposes one surface of the first electrode, is defined in the sacrificial layer.

6. The display device of claim 5, wherein, on a cross section perpendicular to the base layer, a width of the sacrificial layer opening is larger than a width of the third pixel opening.

7. The display device of claim 5, wherein the functional layer comprises:
a first sub-functional layer in contact with the first electrode, the sacrificial layer, the second auxiliary pixel defining film, the first metal layer, and the second metal layer; and
a second sub-functional layer spaced apart from the first sub-functional layer and in contact with the third metal layer and the pixel defining film, and
the second electrode comprises;
a first sub-electrode in contact with the first sub-functional layer and the second metal layer; and
a second sub-electrode in contact with the second sub-functional layer.

8. The display device of claim 1, further comprising an encapsulation-inorganic film that covers the pixel defining film, the first auxiliary pixel defining film, and the light emitting element.

9. The display device of claim 8, further comprising:
a sensor layer on the encapsulation-inorganic film; and
a filling layer between the encapsulation-inorganic film and the sensor layer.

10. The display device of claim 9, wherein the filling layer overlaps an entire surface of each of the pixel defining film and the light emitting element on a plane.

11. The display device of claim 9, wherein the filling layer does not overlap at least a portion of the pixel defining film on a plane.

12. The display device of claim 9, wherein a surface of the encapsulation-inorganic film in contact with the filling layer is hydrophobic.

13. The display device of claim 8, further comprising an auxiliary layer on the encapsulation-inorganic film, wherein the auxiliary layer comprises an organic molecule containing a hydrophilic portion adjacent to the encapsulation-inorganic film and a hydrophobic portion spaced apart from the encapsulation-inorganic film.

14. The display device of claim 13, wherein the auxiliary layer comprises at least one of tridecafluoro-1,2,2-tetrahydrooctyl trichlorosilane (FOTS), perfluoroodecyltrichlorosilane (FDTS), i-butyltrichlorosilane (IBTCS), decyltrichlorosilane (DTCS), octadecyl trichlorosilane (OTS), octyltrichlorosilane (OTCS), n-dodecyltrichlorosilane (DDTCS), trichloro(n-dodecyl)silane (FNTS), trichloro(3,3,3-trifluoropropyl)silane (FPTS), or methoxy polyethylene glycol silane (mPEGS).

15. The display device of claim 1, wherein the second auxiliary pixel defining film comprises an inorganic material.

16. A display device comprising:
a display panel
a sensor layer on the display panel; and
a filling layer between the display panel and the sensor layer,
wherein the display panel comprises:
a base layer;
a circuit layer on the base layer;
a light emitting element including a first electrode on the circuit layer, a functional layer on the first electrode, and a second electrode on the functional layer;

a pixel defining film on the circuit layer and having a first pixel opening, which overlaps the first electrode;

a first auxiliary pixel defining film including a metal substance and is between the pixel defining film and the circuit layer and having a second pixel opening, which overlaps the first electrode;

a second auxiliary pixel defining film between the circuit layer and the first auxiliary pixel defining film and having a third pixel opening, which exposes one surface of the first electrode; and an encapsulation-inorganic film covering the light emitting element, the second auxiliary pixel defining film, the first auxiliary pixel defining film, and the pixel defining film.

17. The display device of claim 16, wherein the first auxiliary pixel defining film comprises:

a first metal layer having a first opening and which is on the second auxiliary pixel defining film;

a second metal layer having a second opening and which is on the first metal layer; and a third metal layer having a third opening and which is on the second metal layer.

18. The display device of claim 17, wherein the functional layer is in contact with the first metal layer and the second metal layer, and the second electrode is in contact with the second metal layer.

19. The display device of claim 17, wherein, on a cross section perpendicular to the base layer, a width of the second opening is larger than a width of the first opening and a width of the third opening.

20. The display device of claim 16, wherein the sensor layer comprises a sensing base layer on the filling layer, a first conductive layer on the sensing base layer, a second conductive layer on the first conductive layer, and a sensing insulation layer between the first conductive layer and the second conductive layer.

21. A method for manufacturing a display device comprising:

providing, on a circuit layer, a first electrode and a preliminary sacrificial layer which covers the first electrode;

providing a second preliminary auxiliary pixel defining film on a preliminary sacrificial layer;

providing a first preliminary auxiliary pixel defining film including a metal on a second preliminary auxiliary pixel defining film;

forming a pixel defining film having a first pixel opening, which exposes a top surface of the first preliminary auxiliary pixel defining film;

patterning the first preliminary auxiliary pixel defining film to form a first auxiliary pixel defining film having a second pixel opening, which exposes a top surface of the second preliminary auxiliary pixel defining film;

patterning the second preliminary auxiliary pixel defining film to form a second auxiliary pixel defining film having a third pixel opening, which exposes a top surface of the preliminary sacrificial layer;

patterning the preliminary sacrificial layer to form a sacrificial layer having a sacrificial layer opening, which exposes a top surface of the first electrode;

providing a functional layer on the exposed top surface of the first electrode;

providing a second electrode on the functional layer; and forming an encapsulation-inorganic film which covers the second electrode, the first auxiliary pixel defining film, and the pixel defining film.

22. The method of claim 21, wherein in the providing of the second electrode, the second electrode is in contact with the functional layer and the first auxiliary pixel defining film.

23. The method of claim 21, wherein the forming of the first preliminary auxiliary pixel defining film comprises:

forming a first preliminary metal layer on the second preliminary auxiliary pixel defining film;

forming a second preliminary metal layer on the first preliminary metal layer; and forming a third preliminary metal layer on the second preliminary metal layer, and the forming of the first auxiliary pixel defining film comprises:

patterning the first preliminary metal layer to form a first metal layer having a first opening;

patterning the second preliminary metal layer to form a second metal layer having a second opening; and patterning the third preliminary metal layer to form a third metal layer having a third opening.

24. The method of claim 23, wherein, on a cross section perpendicular to the first electrode, a width of the second opening is larger than a width of the first opening and a width of the third opening.

25. The method of claim 23, wherein the providing of the functional layer comprises depositing a functional layer forming material on a side surface of the second metal layer at a first angle with respect to a surface parallel to the first electrode, and the providing of the second electrode comprises depositing a second electrode forming material on a side surface of the second metal layer at a second angle smaller than the first angle with respect to the surface parallel to the first electrode.

26. The method of claim 21, wherein, on a cross section perpendicular to the first electrode, a width of the sacrificial layer opening is larger than a width of the third pixel opening.

27. The method of claim 21, wherein the forming of the encapsulation-inorganic film comprises depositing an encapsulation-inorganic material by any one of a chemical vapor deposition method or an atomic layer deposition method.

28. The method of claim 21, further comprising surface-treating a top surface of the encapsulation-inorganic film into hydrophobicity.

29. The method of claim 21, further comprising:

forming a filling layer on the encapsulation-inorganic film; and forming a sensor layer including a sensing base layer, a first conductive layer, a sensing insulation layer, and a second conductive layer on the filling layer.

* * * * *